United States Patent
Minami

(10) Patent No.: US 10,659,026 B2
(45) Date of Patent: May 19, 2020

(54) SEMICONDUCTOR DEVICE

(71) Applicant: Renesas Electronics Corporation, Tokyo (JP)

(72) Inventor: Masataka Minami, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/100,370

(22) Filed: Aug. 10, 2018

(65) Prior Publication Data

US 2019/0123729 A1    Apr. 25, 2019

(51) Int. Cl.
| | | |
|---|---|---|
| *G05F 1/40* | (2006.01) | |
| *H03K 5/24* | (2006.01) | |
| *G05F 3/22* | (2006.01) | |
| *G05F 3/24* | (2006.01) | |
| *G05F 3/26* | (2006.01) | |
| *H03M 1/12* | (2006.01) | |

(52) U.S. Cl.
CPC ........... *H03K 5/2445* (2013.01); *G05F 3/225* (2013.01); *G05F 3/245* (2013.01); *G05F 3/267* (2013.01); *H03M 1/12* (2013.01); *H03K 5/2472* (2013.01)

(58) Field of Classification Search
CPC ....... H03K 5/2445; G05F 3/225; G05F 3/245; G05F 3/267
See application file for complete search history.

(56) References Cited

U.S. PATENT DOCUMENTS

| | | | | |
|---|---|---|---|---|
| 5,334,885 | A * | 8/1994 | Morris | ............. H03K 19/00384 326/21 |
| 5,367,204 | A * | 11/1994 | Mattison | ............ H03K 5/15013 327/141 |
| 5,661,481 | A | 8/1997 | Muramatsu | |
| 6,967,876 | B2 * | 11/2005 | Rolandi | ................ G11C 16/12 365/185.2 |
| 2013/0176058 | A1 | 7/2013 | Iwasa | |

FOREIGN PATENT DOCUMENTS

| | | |
|---|---|---|
| JP | H07-326970 A | 12/1995 |
| JP | 2013-141113 A | 7/2013 |

OTHER PUBLICATIONS

Phillip E. Allen and Douglas R. Holberg,"CMOS Analog Circuit Design", Second Edition, Oxford University, Press., p. 445, 2002.

* cited by examiner

*Primary Examiner* — Dinh T Le
(74) *Attorney, Agent, or Firm* — McDermott Will & Emery LLP

(57) ABSTRACT

A semiconductor device that can perform voltage monitoring with a small circuit area is provided. The resistive subdivision circuit RDIV performs the resistive subdivision of the input voltage Vin by means of the input ladder resistor (R1-R4), and drives the nMOS transistors MN1-MN3 by the subdivided input voltages Vi1-Vi3 each having different resistive subdivision ratios, respectively. The pMOS transistor MP0 is provided in common for the pMOS transistors MP1-MP3, and configures a current mirror circuit with each of the pMOS transistors MP1-MP3. The bias current generating circuit IBSG supplies a bias current to the pMOS transistor MP1.

12 Claims, 17 Drawing Sheets

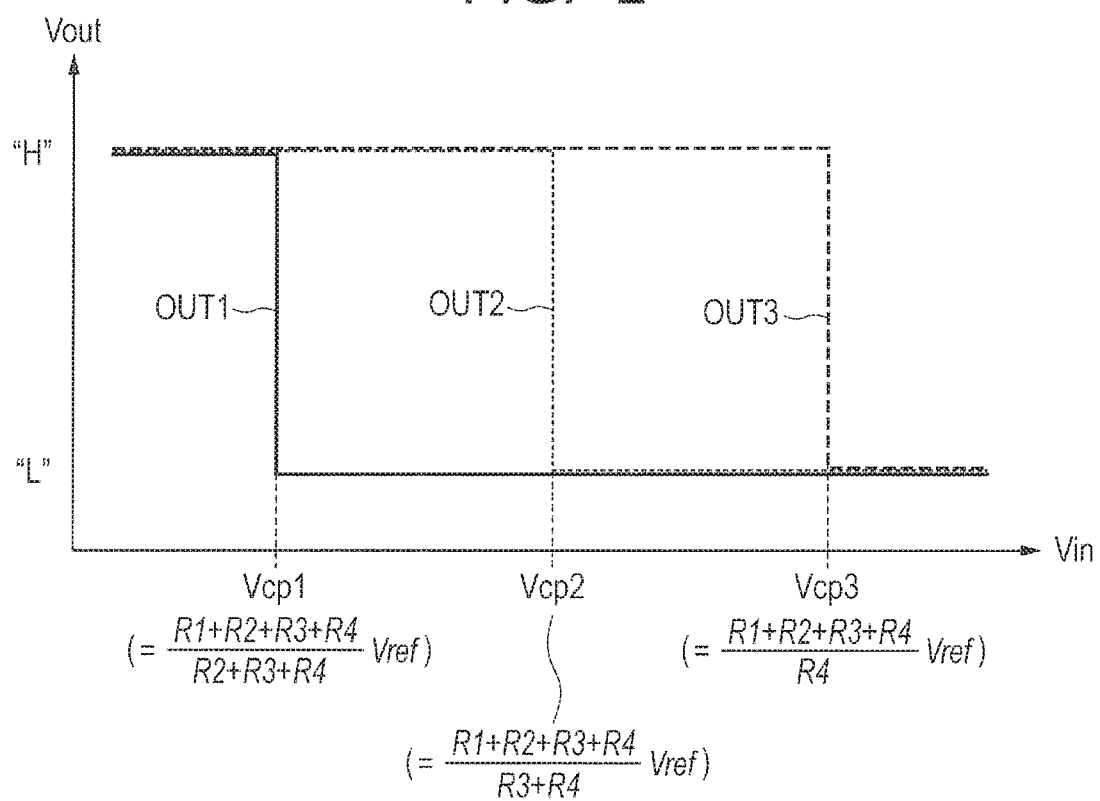

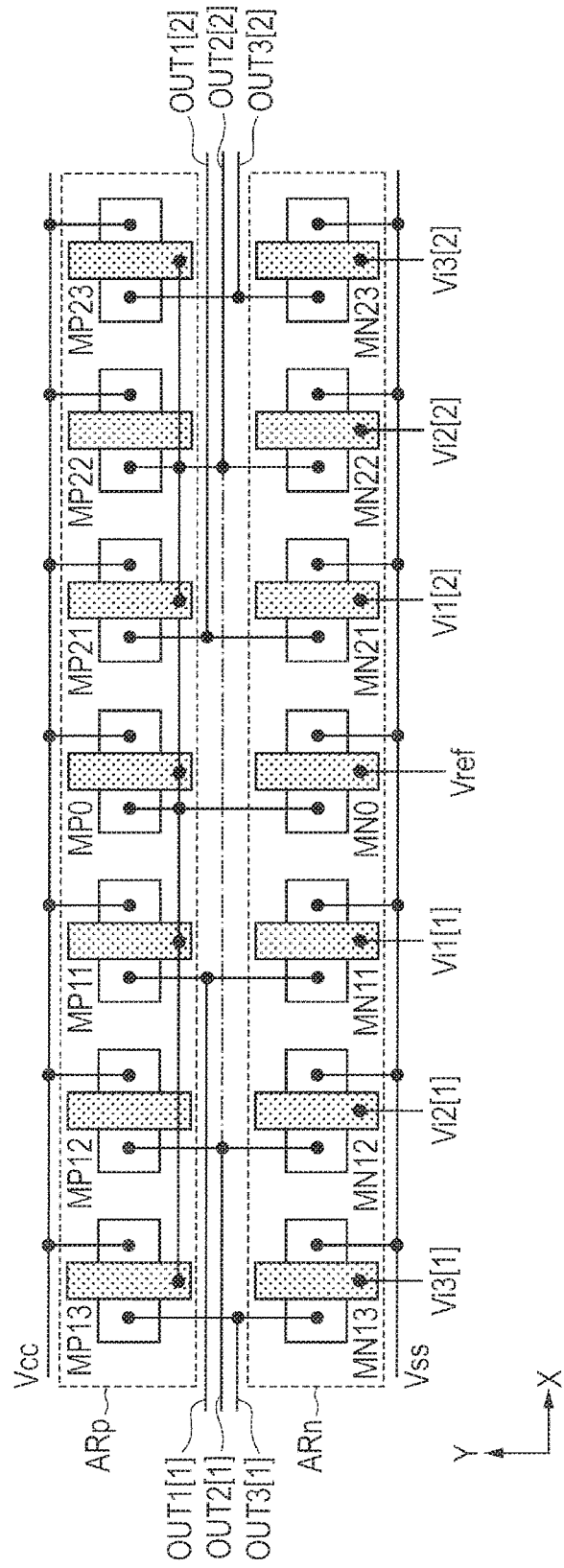

SEMICONDUCTOR DEVICE

CROSS-REFERENCE TO RELATED APPLICATIONS

The disclosure of Japanese Patent Application No. 2017-202687 filed on Oct. 19, 2017 including the specification, drawings, and abstract is incorporated herein by reference in its entirety.

BACKGROUND

The present invention relates to a semiconductor device and specifically relates to a semiconductor device that monitors various voltages, for example.

Patent Literature 1 discloses a voltage comparator circuit that compares the magnitude of two power supply voltages. Patent Literature 2 discloses an A/D converter that includes multiple comparators to compare an input signal with mutually different reference voltages, and an encoder that encodes the comparison result. Non Patent Literature 1 shows a circuit configuration of a general comparator including seven transistors.

(Patent Literature 1) Japanese Unexamined Patent Application Publication No. 2013-141113

(Patent Literature 2) Japanese Unexamined Patent Application Publication No. Hei 07(1995)-326970

(Non-Patent Literature 1) Phillip E. Allen and Douglas R. Holberg; "CMOS Analog Circuit Design", Second Edition, Oxford University Press, p. 445

SUMMARY

For example, in fields typified by the field of vehicles that demands a high degree of safety, there are demands to monitor multiple power supply voltages in real time using multiple reference voltages. In that case, it is conceivable to employ a comparator including seven transistors such as shown in Non-Patent Literature 1. In this case, however, as the number (N) of the monitoring target voltages increases and the number (M) of the reference voltages for every monitoring target voltage increases, the number (N×M×7, for example) of the transistors required also increases. As a result, it is likely that there arises increase of the circuit area and the power consumption.

The present invention to be described in the following embodiments has been accomplished in view of the above, and the other issues and new features of the present invention will become clear from the present description and the accompanying drawings.

A semiconductor device according to one embodiment includes multiple output nodes, multiple first transistors, multiple second transistors, a resistive subdivision circuit, a third transistor, and a bias current generating circuit. The output nodes output the comparison result between an input voltage and multiple comparison voltages, respectively. The first transistors are coupled respectively between the output nodes and a first power supply, and the second transistors are coupled respectively between the output nodes and a second power supply. The resistive subdivision circuit performs resistive subdivision of the input voltage by means of an input ladder resistor and drives the second transistors respectively by multiple subdivided input voltages with different resistive subdivision ratios. The third transistor is provided in common for the first transistors and configures a current mirror circuit with each of the first transistors. The bias current generating circuit supplies a bias current to the third transistor.

According to the one embodiment, it is possible to perform voltage monitoring with a small circuit area.

BRIEF DESCRIPTION OF THE DRAWINGS

FIG. 2 is a schematic diagram illustrating an example of operation of the voltage monitoring block illustrated in FIG. 1;

FIG. 9 is a plan view illustrating an example of the layout configuration of a part of the voltage monitoring block illustrated in FIG. 6;

DETAILED DESCRIPTION

The following embodiment is explained by being split to several sections or embodiments when it is necessary for convenience. However, except when specified clearly in particular, the divided sections or embodiments are not mutually unrelated, however, one is regarded as a modified example, details, or a supplementary explanation of some or all of the other. When the number of elements (including the number, a numerical value, an amount, a range) are referred to in the following embodiment, it is not always restricted to the specific number of elements but it may be more or less than the specific number, except when it is specified clearly and when it is theoretically and clearly restricted to the specific number.

In the following embodiment, it is needless to say that the component (including an element step) is not necessarily indispensable except when it is specified clearly and when it is theoretically thought that it is clearly indispensable. Similarly, in the following embodiment, when referring to the form, positional relationship, etc., of a component, etc., what resembles to or is substantially similar to the form, etc. shall be included, except when it is clearly specified and when it is considered theoretically that it is not so. The same applies to the numerical value and the range.

Although not restricted in particular, a circuit element that configures each functional block of the embodiments is formed on a semiconductor substrate such as single crystal silicon by employing the well-known CMOS (complementary MOS) transistor integrated circuits technology. In the embodiment, a MOSFET (Metal Oxide Semiconductor Field Effect Transistor) (abbreviated as a MOS transistor) is used as an example of a MISFET (Metal Insulator Semiconductor Field Effect Transistor). However, it does not suggest to exclude a non-oxide film as a gate insulating film. In the present specification, an n-channel MOS transistor is called an nMOS transistor, and a p-channel MOS transistor is called a pMOS transistor.

Hereinafter, embodiments of the present invention will be explained in detail with reference to the accompanying drawings. In the entire diagrams for explaining the embodiments of the present invention, the same symbol is attached to the same component as a rule, and the repeated explanation thereof is omitted.

Embodiment 1

<<The Configuration and Operation of a Voltage Monitoring Block>>

Figure 1:
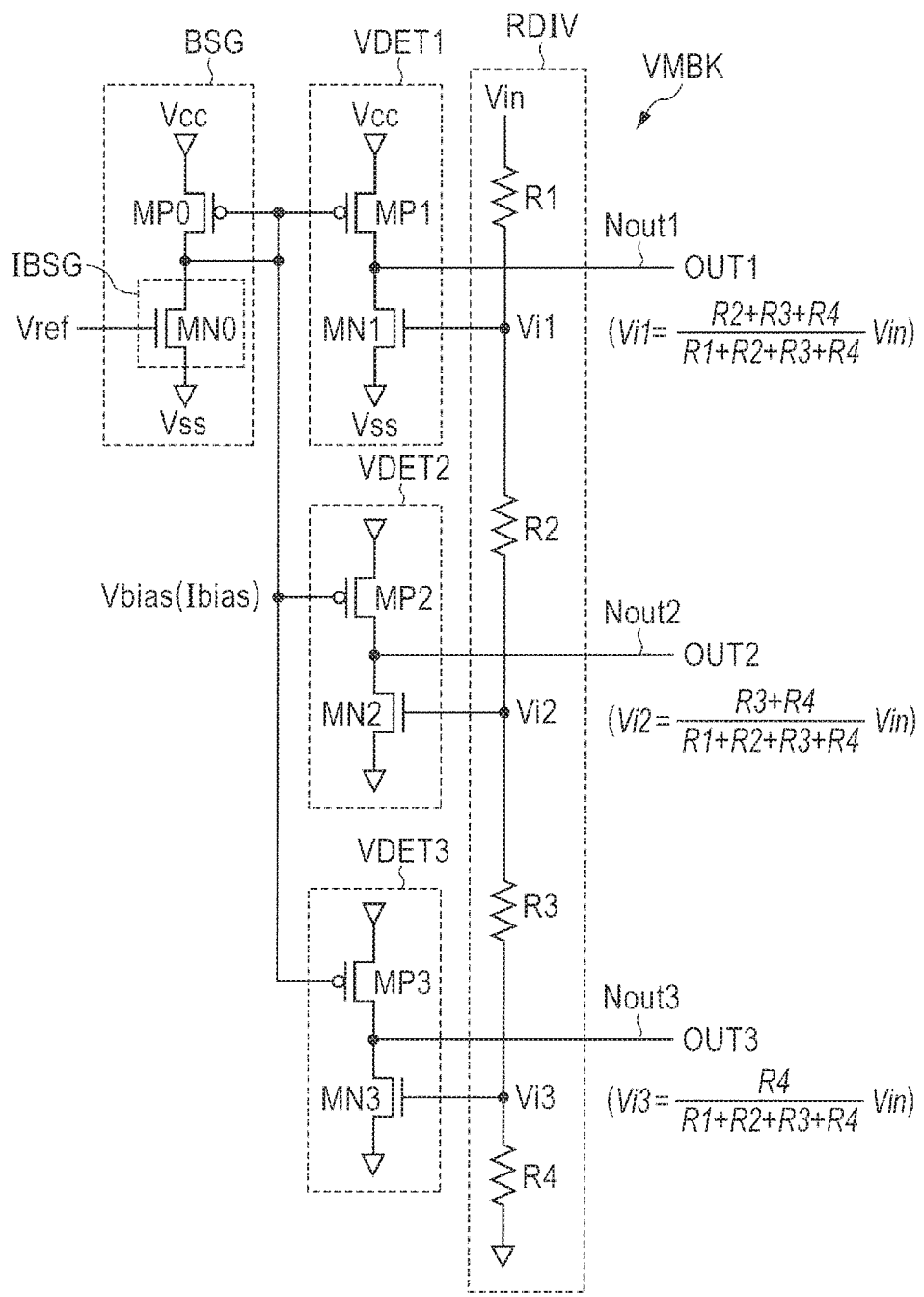
FIG. 1 is a circuit diagram illustrating an example of the configuration of a voltage monitoring block included in a semiconductor device according to Embodiment 1 of the present invention.

FIG. 1 is a circuit diagram illustrating an example of the configuration of a voltage monitoring block included in a semiconductor device according to Embodiment 1 of the present invention. Roughly, the voltage monitoring block VMBK illustrated in FIG. 1 monitors an input voltage Vin, by comparing the input voltage Vin with multiple comparison voltages (three voltages in the present example) respectively, and by outputting multiple output signals OUT1-OUT3 as the comparison result to multiple output nodes Nout1-Nout3, respectively. The voltage monitoring block VMBK concerned includes a bias generating circuit BSG, multiple (three) voltage detection circuits VDET1-VDET3, and a resistive subdivision circuit RDIV.

The voltage detection circuits VDET1-VDET3 include pMOS transistors MP1-MP3 and nMOS transistors MN1-MN3, respectively. The pMOS transistors MP1-MP3 are coupled respectively between the output nodes Nout1-Nout3 and a high-potential-side power supply Vcc, and the nMOS transistors MN1-MN3 are coupled respectively between the output nodes Nout1-Nout3 and a low-potential-side power supply Vss.

The resistive subdivision circuit RDIV includes an input ladder resistor configured with resistive elements R1-R4 coupled in series. The resistive subdivision circuit RDIV performs the resistive subdivision of the input voltage Vin by means of the input ladder resistor (R1-R4), and drives gates of the nMOS transistors MN1-MN3, respectively by multiple (three) subdivided input voltages Vi1-Vi3 with different resistive subdivision ratios. In the present example, the resistive elements R1, R2, R3, and R4 are coupled in series between the input voltage Vin and the power supply Vss, in this order when viewed from the side of the input voltage Vin. A subdivided input voltage Vi1 is generated at a resistive subdivision node between the adjoining resistive elements R1 and R2, a subdivided input voltage Vi2 is generated at the resistive subdivision node between the adjoining resistive elements R2 and R3, and a subdivided input voltage Vi3 is generated at the resistive subdivision node between the adjoining resistive element R3 and R4.

The bias generating circuit BSG includes a pMOS transistor MP0 and an nMOS transistor MN0. The pMOS transistor MP0 is provided in common for the pMOS transistors MP1-MP3, and configures a current mirror circuit with each of the pMOS transistors MP1-MP3. The nMOS transistor MN0 is coupled between the pMOS transistor MP0 and the power supply Vss. With the gate being driven by a predetermined reference voltage Vref, the nMOS transistor MN0 functions as a bias current generating circuit IBSG that supplies a bias current to the pMOS transistor MP0.

Such a bias generating circuit BSG can be said to be a bias voltage generating circuit that generates a bias voltage Vbias via the diode-coupled pMOS transistor MP0 and that supplies the bias voltage Vbias concerned to the pMOS transistors MP1-MP3. In another viewpoint, the bias generating circuit BSG can also be said to be a bias current generating circuit that generates a bias current Ibias and supplies the bias current Ibias concerned to the pMOS transistors MP1-MP3 via the pMOS transistor MP0 as one of the current mirror pair.

FIG. 2 is a schematic diagram illustrating an example of operation of the voltage monitoring block illustrated in FIG. 1. Here, it is assumed that the pMOS transistor MP0 and each of the pMOS transistors MP1-MP3 have the same transistor size and the same threshold voltage (Vth). It is also assumed that the nMOS transistor MN0 and each of the nMOS transistors MN1-MN3 have the same transistor size and the same threshold voltage (Vth). In this case, the output signal OUT1 becomes equal to the bias voltage Vbias when "Vi1=Vref", it becomes an "L" level with reference to the bias voltage Vbias when "Vi1>Vref", and it becomes an "H" level with reference to the bias voltage Vbias when "Vi1<Vref." The output signals OUT2 and OUT5 also change in the same manner as the output signal OUT1. It is desirable to design the value of the bias voltage Vbias to be around "(Vcc−Vss)/2", for example.

In FIG. 2, when the input voltage Vin is sufficiently low, the relation of "Vi3<Vi2<Vi1<Vref" holds. Therefore, all of the output signals OUT1-OUT3 become an "H" level. When the input voltage Vin is increased, first, the subdivided input voltage Vi1 among the subdivided input voltages Vi1-Vi3 reaches the reference voltage Vref, and when the relation of "Vi1>Vref" is satisfied, the output signal OUT1 makes a transition from an "H" level to an "L" level. Consequently, the voltage detection circuit VDET1 can detect the magnitude of the input voltage Vin, equating "Vin" at the time of "Vi1=Vref" to a comparison voltage Vcp1 expressed by Equation (1).

$$Vcp1=\{(R1+R2+R3+R4)/(R2+R3+R4)\}\times Vref \quad (1)$$

When the input voltage Vin is increased further, the subdivided input voltage Vi2 also reaches the reference voltage Vref, and when the relation of "Vi2>Vref" is satisfied, the output signal OUT2 makes a transition from an "H" level to an "L" level. Consequently, the voltage detection circuit VDET2 can detect the magnitude of the input voltage Vin, equating "Vin" at the time of "Vi2=Vref" to a comparison voltage Vcp2 expressed by Equation (2). In the same manner, the voltage detection circuit VDET3 can detect the magnitude of the input voltage Vin, equating "Vin" at the time of "Vi3=Vref" to a comparison voltage Vcp3 expressed by Equation (3).

$$Vcp2=\{(R1+R2+R3+R4)/(R3+R4)\}\times Vref \quad (2)$$

$$Vcp3=\{(R1+R2+R3+R4)/R4\}\times Vref \quad (3)$$

Accordingly, on the basis of the combination of the logical levels of the output signals OUT1-OUT3, it is possible to detect whether the input voltage Vin is smaller than "Vcp1", whether the input voltage Vin is greater than "Vcp1" and smaller than "Vcp2", whether the input voltage Vin is greater than "Vcp2" and smaller than "Vcp3", or whether the input voltage Vin is greater than "Vcp3." In this case, in order to make steep the transition of the output signals OUT1-OUT3, a CMOS inverter circuit that has a logical determination threshold equal to the bias voltage Vbias may be arranged in the poststage of the output signals OUT1-OUT3.

Here, it is assumed that the pMOS transistor MP0 and each of the pMOS transistors MP1-MP3 have the same transistor size (and the same Vth), and that the nMOS transistor MN0 and each of the nMOS transistors MN1-MN3 have the same transistor size (and the same Vth). Accordingly, it is possible to determine easily the magnitude of comparison voltages Vcp1-Vcp3 as expressed by Equations (1)-(3), and it becomes easy to maintain the symmetry in the actual layout (leading to the reduction of manufacturing variations). Therefore, it is possible to achieve the improvement in the voltage detection precision.

However, fundamentally, the transistors of the present invention are not necessarily restricted to the same transistor size, and the bias generating circuit BSG is not restricted to the configuration as illustrated in FIG. 1, either. That is, fundamentally, it suffices that the bias generating circuit BSG has the configuration in which the same bias current with the proven current value can be made to flow to the pMOS transistors MP1-MP3, or the configuration in which the same bias voltage with the proven voltage value can be applied to the gates of the pMOS transistors MP1-MP3. For example, the logical level of the output signal OUT1 (same as for OUT2 and OUT5) is determined by the magnitude relation of this bias current and the current flowing through the nMOS transistor MN1. If the value of the gate voltage of the nMOS transistor MN1 when these two electric currents become equal is calculated, the calculated value of the gate voltage serves as the substitute of the reference voltage Vref illustrated in FIG. 1. The comparison voltage in this case is given by replacing "Vref" in Equation (1) with the value of the calculated gate voltage.

The reference voltage Vref is generated by subdividing a band gap voltage supplied by the band gap reference circuit, for example. Ordinarily, temperature dependence of the band gap voltage is extremely small. Therefore, the temperature dependence of the comparison voltages Vcp1-Vcp3 given by Equation (1)-Equation (3) also becomes small, and it is possible to achieve the improvement in the voltage detection precision. However, when the reference voltage Vref is high, the bias current Ibias becomes large, causing the increase in the power consumption. Therefore, it is desirable that the reference voltage Vref is set less than the order of "Vth+0.2 V" for example, compared with the threshold voltage (Vth) of the nMOS transistor MN0. It may be less than the threshold voltage (Vth), depending on circumstances.

<<The Application Example of the Voltage Monitoring Block>>

Figure 3A:
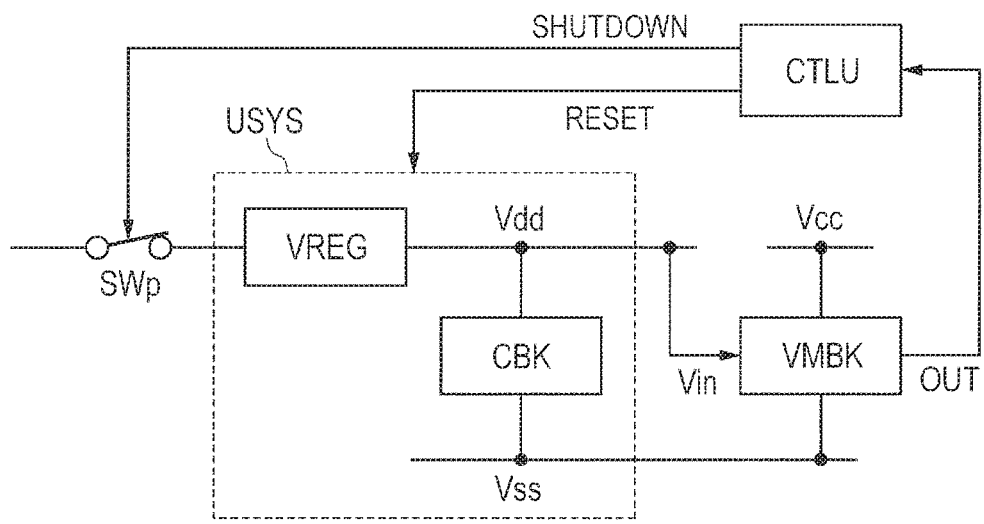
FIG. 3A is a schematic diagram illustrating an example of the configuration of a monitoring system applied with the voltage monitoring block illustrated in FIG. 1.
Figure 3B:
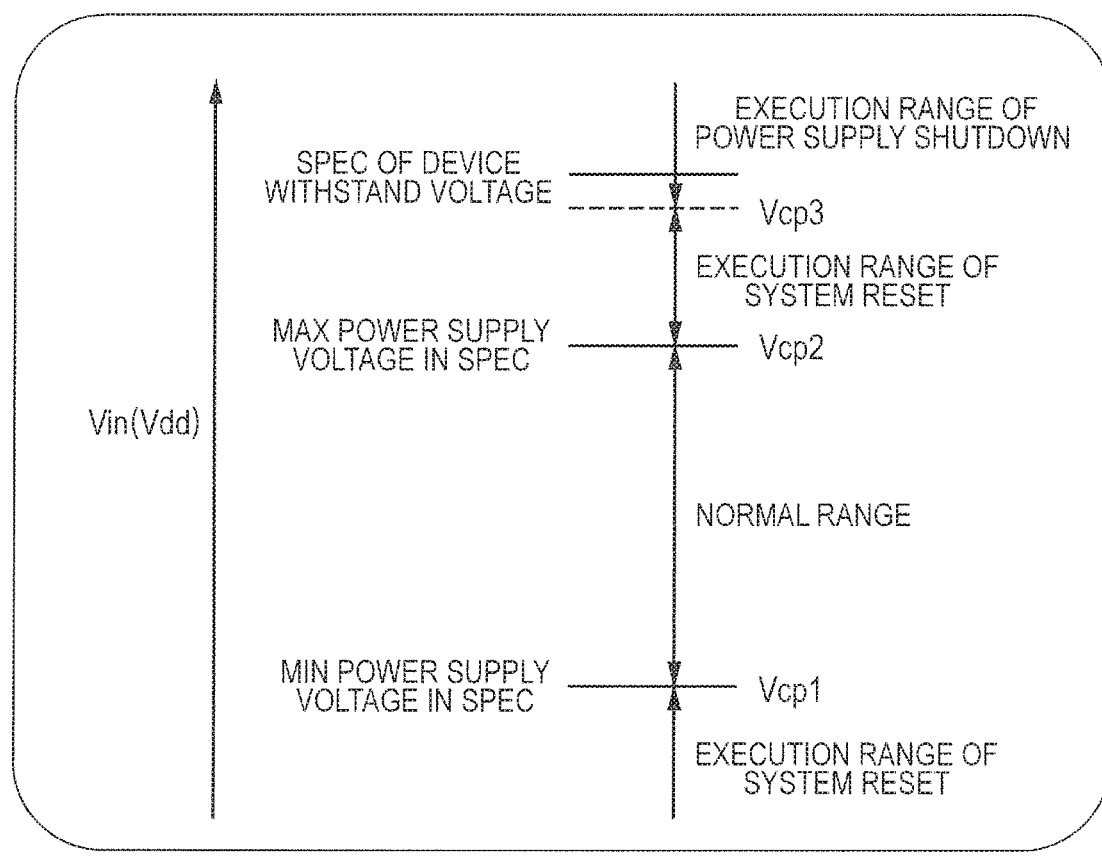
FIG. 3B is an explanatory drawing illustrating the example of operation of FIG. 3A.

FIG. 3A is a schematic diagram illustrating an example of the configuration of a monitoring system applied with the voltage monitoring block illustrated in FIG. 1. FIG. 3B is an explanatory drawing illustrating the example of operation of FIG. 3A. In FIG. 3A, a user system USYS performing predetermined user function is provided. The user system USYS includes a power regulator VREG that generates a predetermined internal power supply Vdd from an external power supplied via a power switch SWp, and a circuit block CBK that operates by the internal power supply Vdd concerned and the low-potential-side power supply Vss, to perform the predetermined user function.

Here, the voltage monitoring block VMBK operates by the power supply Vcc different from the internal power supply Vdd (for example, the external power), and monitors the voltage level of the internal power supply Vdd of the user system USYS, regarding the internal power supply Vdd as the input voltage Vin. A control unit CTLU controls the whole user system USYS in response to the output signal OUT as the monitored result of the voltage monitoring block VMBK.

In this case, the comparison voltages Vcp1-Vcp3 of the voltage monitoring block VMBK illustrated in FIG. 1 are defined as shown in FIG. 3B, for example. The comparison voltage Vcp1 is set as the minimum value of the power supply voltage Vdd specified by the specification, and the comparison voltage Vcp2 is set as the maximum value of the power supply voltage Vdd specified by the specification. The comparison voltage Vcp3 is set as a value a little lower than the value of the device withstand voltage of each element that configures the circuit block CBK. The control unit CTLU operates in response to the output signal OUT (OUT1-OUT3 of FIG. 2) based on such comparison voltages Vcp1-Vcp3.

Specifically, in the case where the voltage level of the internal power supply Vdd is smaller than the comparison voltage Vcp1 or exists between the comparison voltage Vcp2 and the comparison voltage Vcp3, the control unit CTLU resets the user system USYS because the user system USYS may be unable to perform normal operation, and performs control to regenerate the internal power supply Vdd. On the other hand, when the voltage level of the internal power supply Vdd is greater than the comparison voltage Vcp3, the control unit CTLU controls the power switch SWp to OFF and cuts down the power supply of the user system USYS, in order to protect the circuit block CBK from exceeding the withstand voltage.

The number of the voltage detection circuits is not restricted to three (VDET1-VDET3) as illustrated in FIG. 1, but may be two or more, as a matter of course. For example, when the number of the voltage detection circuits is four or more, it is possible to monitor the voltage level of the system more minutely and to control the system more properly according to the monitored result.

<<The Layout Configuration of the Voltage Monitoring Block>>

Figure 4:
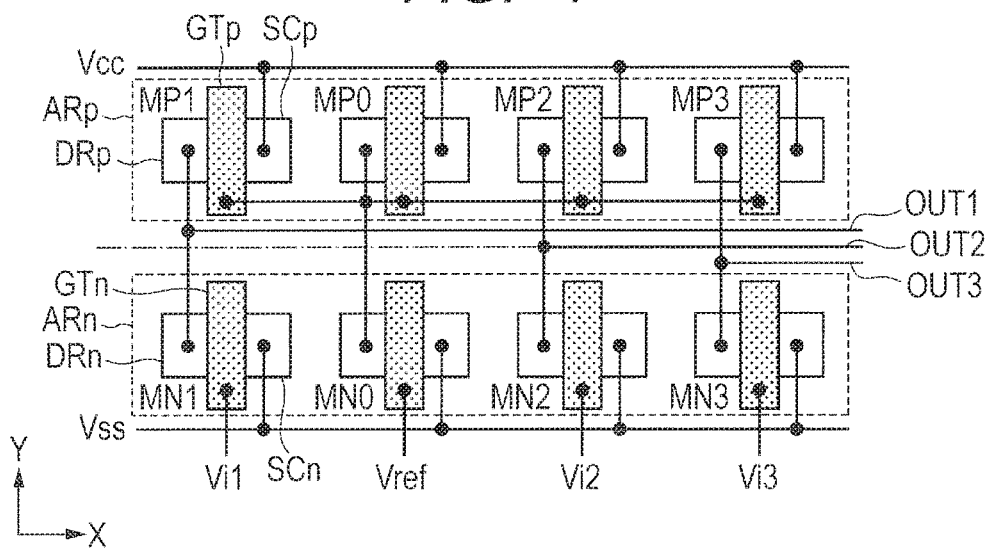
FIG. 4 is a plan view illustrating an example of the layout configuration of a part of the voltage monitoring block illustrated in FIG. 1.

FIG. 4 is a plan view illustrating an example of the layout configuration of a part of the voltage monitoring block illustrated in FIG. 1. FIG. 4 illustrates an example of the configuration of the bias generating circuit BSG and the voltage detection circuits VDET1-VDET3 illustrated in FIG. 1. In FIG. 4, the pMOS transistors MP1-MP3 in the voltage detection circuits VDET1-VDET3 are arranged collaterally in the X-axis direction in a pMOS forming region ARp. In the same manner, the nMOS transistors MN1-MN3 in the voltage detection circuits VDET1-VDET3 are arranged collaterally in the X-axis direction in the nMOS forming region ARn. The pMOS forming region ARp and the nMOS forming region ARn are arranged in close proximity in the Y-axis direction intersecting with the X axis direction. By arranging each transistor regularly in a predetermined direction in this way, it is possible to reduce the manufacturing variations (for example, variations in the relative transistor size and variations in the threshold voltage).

For example, the pMOS forming region ARp is an n-type well region, and the nMOS forming region ARn is a p-type well region. Each pMOS transistor (for example, MP1) includes a source region SCp and a drain region DRp as a p-type diffusion layer, and a gate layer GTp arranged between them. In the same manner, each nMOS transistor (for example, MN1) includes a source region SCn and a drain region DRn as an n-type diffusion layer, and a gate layer GTn arranged between them.

On the other hand, the pMOS transistor MP0 in the bias generating circuit BSG is arranged within the row of the pMOS transistors MP1-MP3 (here between MP1 and MP2) in the pMOS forming region ARp. In the same manner, the nMOS transistor MN0 in the bias generating circuit BSG is arranged within the row of the nMOS transistors MN1-MN3 (here between MN1 and MN2) in the nMOS forming region ARn. By arranging the bias generating circuit BSG near the center in this way, it is possible to shorten a current mirror wiring from the bias generating circuit BSG to each of the voltage detection circuits VDET1-VDET3. Consequently, the voltage drop in the current mirror wiring is suppressed, leading to the improvement of the voltage detection precision.

Here, the pMOS transistor (for example, MP1) and the nMOS transistor (MN1) making a pair are closely arranged. Therefore, it is also possible to shorten the wire length between them. Although it is not shown in the figure, the input ladder resistor (R1-R4) in the resistive subdivision circuit RDIV is formed using a gate layer, for example.

Figure 5:
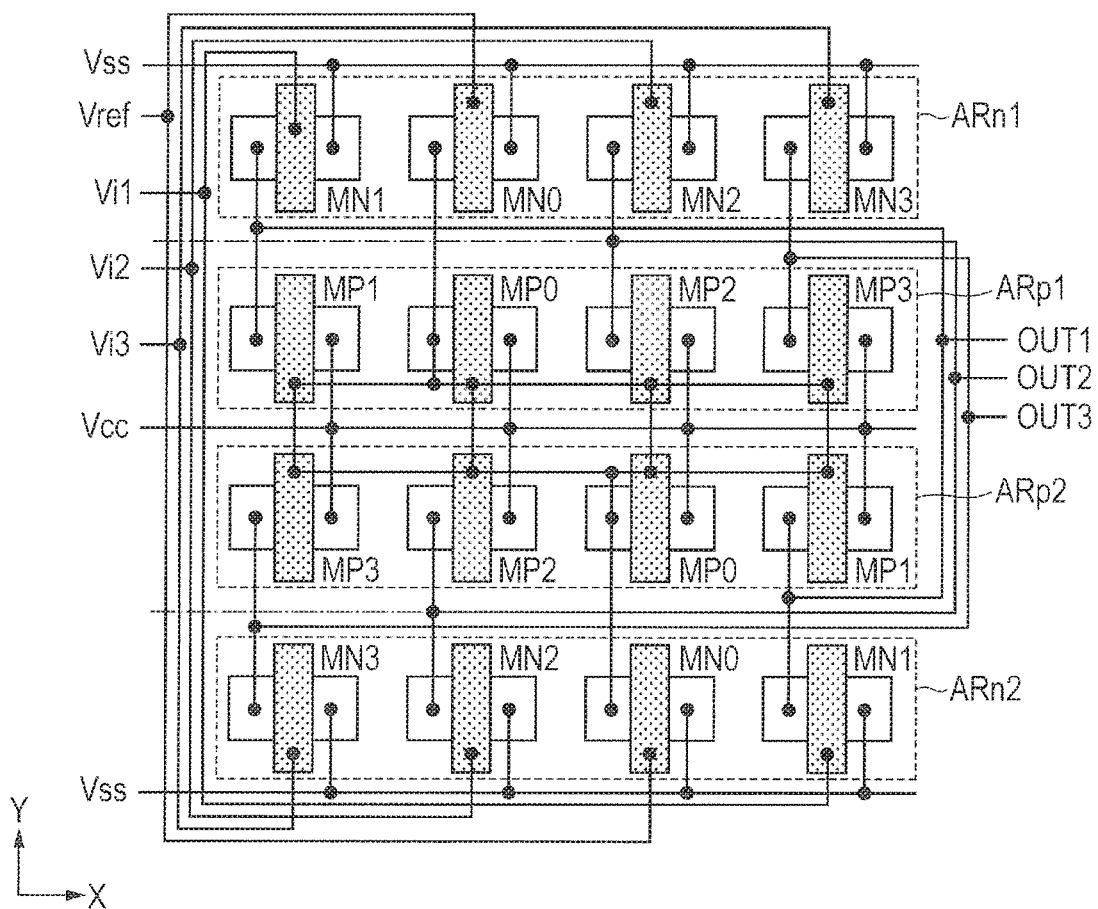
FIG. 5 is a plan view illustrating another example of the layout configuration of a part of the voltage monitoring block illustrated in FIG. 1.

FIG. 5 is a plan view illustrating another example of the layout configuration of a part of the voltage monitoring block illustrated in FIG. 1. In FIG. 5, each of the pMOS transistors MP0-MP3 and each of the nMOS transistors MN0-MN3 are comprised of two unit transistors coupled in parallel. Accordingly, with the pMOS forming region ARp and the nMOS forming region ARn as illustrated in FIG. 4 as a group, two groups of the pMOS forming regions ARp1 and ARp2 and the nMOS forming regions ARn1 and ARn2 are arranged in the Y-axis direction. Then, the pMOS transistors MP0-MP3 and the nMOS transistors MN0-MN3 are arranged in the common centroid layout.

The common centroid is an arrangement system in which one transistor is configured with multiple unit transistors and the centroid position based on the arrangement of the multiple unit transistors is given by a certain point common to the multiple transistors. For example, the centroid position of two unit transistors that configure the pMOS transistor MP1, the centroid position of two unit transistors that configure the pMOS transistor MP2, and the centroid position of two unit transistors that configure the nMOS transistor MN1 are concurrently set at the center point of the whole layout illustrated in FIG. 5. To employ such a layout enhances the symmetry of the layout when compared with the case illustrated in FIG. 4. Therefore, it is possible to further reduce the manufacturing variations. Consequently, it is possible to attain further improvement in the voltage detection precision.

The Main Effects of Embodiment 1

Figure 20:
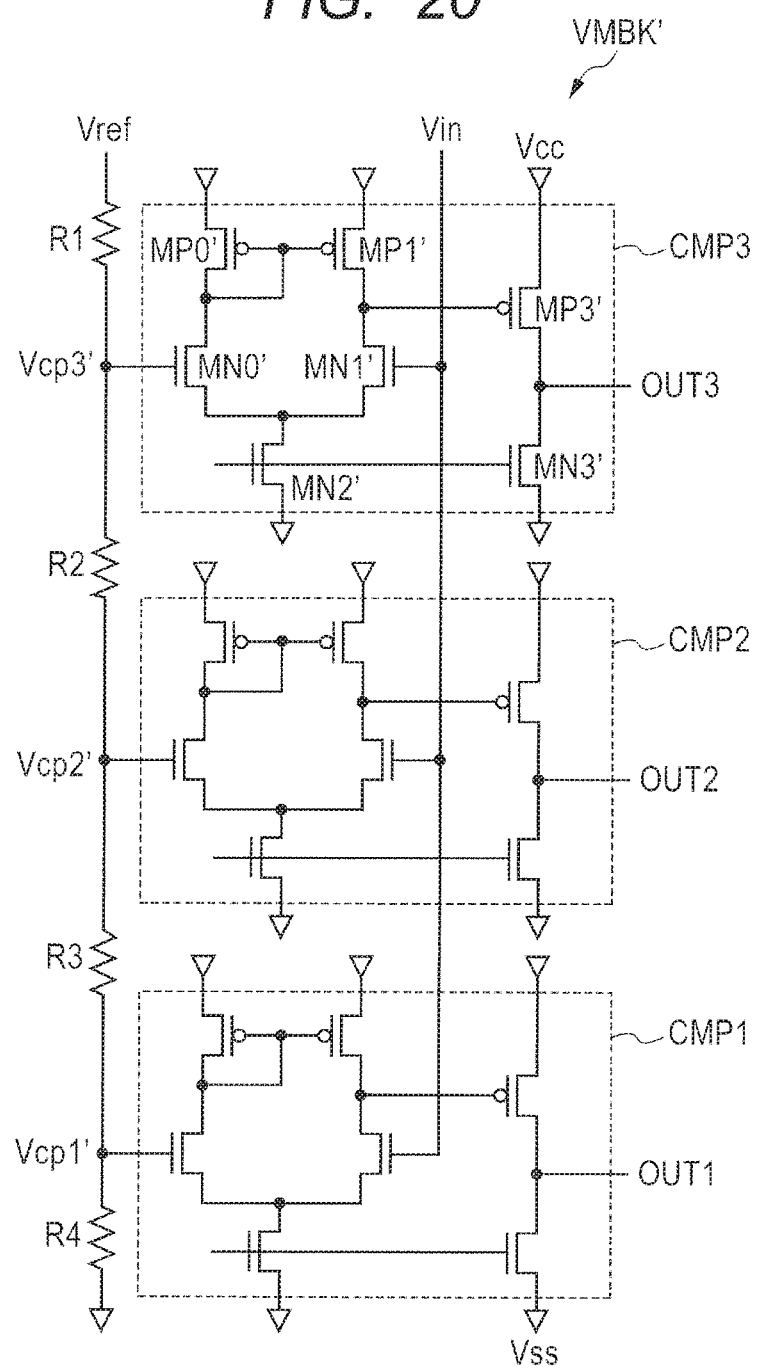
FIG. 20 is a circuit diagram illustrating an example of the configuration of a voltage monitoring block included in a semiconductor device as the comparative example of the present invention.

FIG. 20 is a circuit diagram illustrating an example of the configuration of a voltage monitoring block included in a semiconductor device as the comparative example of the present invention. The voltage monitoring block VMBK' illustrated in FIG. 20 includes three comparator circuits CMP1-CMP3 and a ladder resistor (R1-R4) that generates comparison voltages Vcp1'-Vcp3' for the three comparator circuits by subdividing a reference voltage Vref. Each of the comparator circuits CMP1-CMP3 is comprised of seven transistors including pMOS transistors MP0', MP1', and MP3', and nMOS transistors MN0', MN1', MN2', and MN3'.

The comparator circuits CMP1-CMP3 have the same function as the voltage detection circuits VDET1-VDET3 illustrated in FIG. 1, respectively. For example, the comparator circuit CMP1 compares the comparison voltage Vcp1' applied to the nMOS transistor MN0' as one of a differential pair, with the input voltage Vin applied to the nMOS transistor MN1' as the other of the differential pair, and outputs an output signal OUT1 as the comparison result.

When the voltage monitoring block VMBK illustrated in FIG. 1 is used, the following effects are obtained in comparison with the example of the configuration illustrated in FIG. 20. Firstly, it is possible to make small the circuit area. For example, 21 transistors are required in FIG. 20. On the other hand, only eight transistors are required in FIG. 1, since the configuration of the voltage detection circuits VDET1-VDET3 is simplified and the bias generating circuit BSG is shared by the voltage detection circuits VDET1-VDET3.

Secondly, it is possible to reduce the power consumption. For example, in FIG. 20, three current paths exist in one comparator circuit, and when the number of the comparison voltages (that is, the number of the comparator circuits) is assumed to be N, 3N current paths exist. On the other hand, in FIG. 1, one current path exists in one voltage detection circuit, and when the number of the comparison voltages is assumed to be N, N current paths exist. Adding the current path in the bias generating circuit BSG to this, only N+1 current paths in total are required.

Thirdly, it is possible to achieve the improvement in the voltage detection precision in some cases. In FIG. 20, on the side of the reference voltage Vref, for example, threshold voltage variations may occur between the nMOS transistor MN0' of the comparator circuit CMP1 and the nMOS transistor MN0' of the comparator circuit CMP2. On the other hand, in FIG. 1, the side of the reference voltage Vref is comprised of one common nMOS transistor MN0. Therefore, such threshold voltage variations do not arise. As a result, theoretically, the relative amount of the variations in the voltage detection circuits VDET1-VDET3 becomes $1/\sqrt{2}$ times of the relative amount of the variations in the comparator circuits CMP1-CMP3. Therefore, it is possible to attain the improvement in the voltage detection precision as much as the amount of the reduced variations. The first to third effects described above become more remarkable as the number of the comparison voltages (the number of the voltage detection circuits) increases.

It should be noted that the voltage monitoring block VMBK illustrated in FIG. 1 is comprised of the MOS transistors. However, it is not necessarily restricted to the MOS transistors, and the voltage monitoring block VMBK may be comprised of bipolar transistors, depending on circumstances. Depending on circumstances, the voltage monitoring block VMBK illustrated in FIG. 1 may employ the configuration in which the current mirror circuit is comprised of nMOS transistors and the subdivided input voltage is applied to pMOS transistors.

Embodiment 2

<<The Configuration of the Voltage Monitoring Block>>

Figure 6:
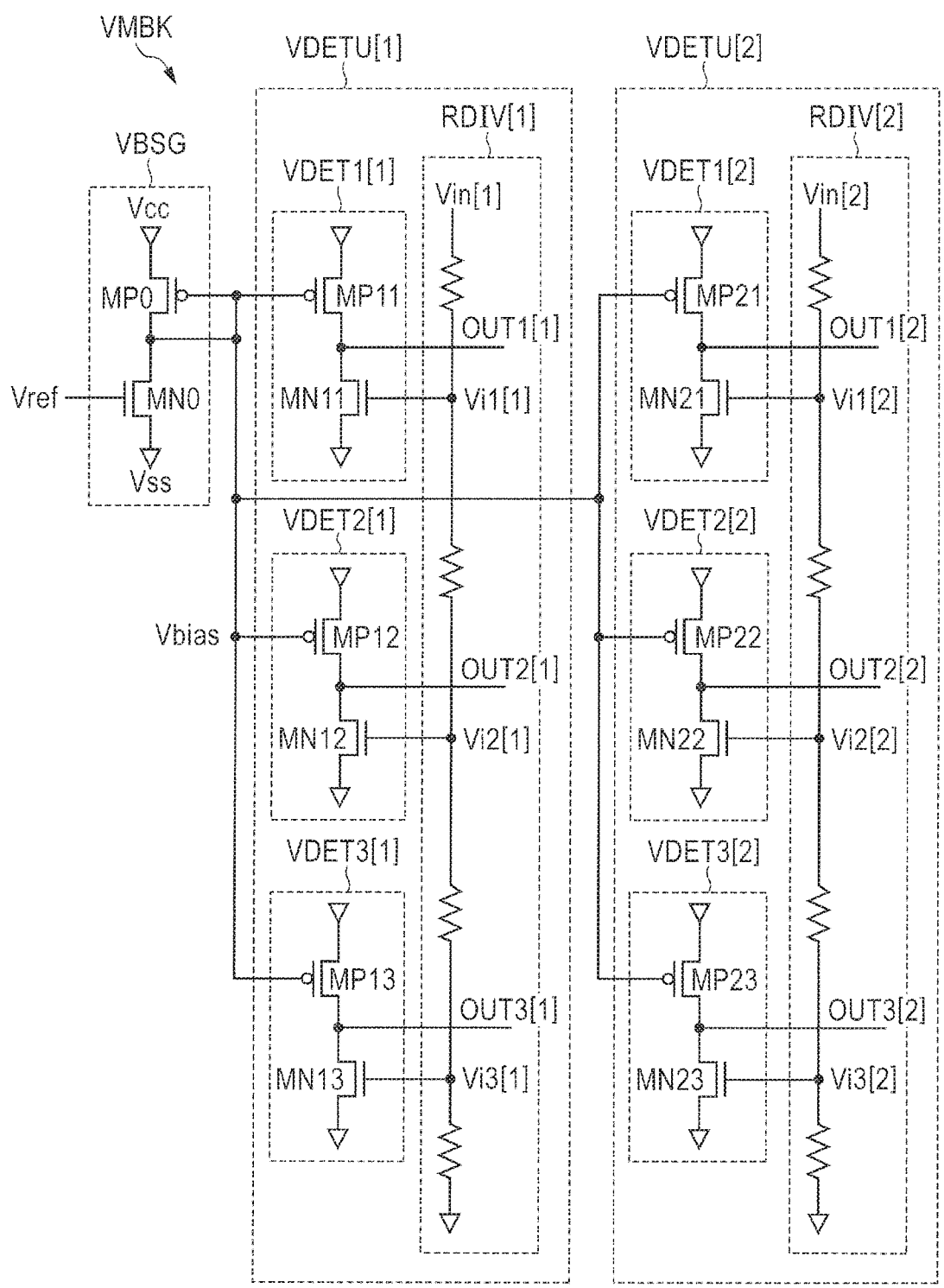
FIG. 6 is a circuit diagram illustrating an example of the configuration of a voltage monitoring block included in a semiconductor device according to Embodiment 2 of the present invention.

FIG. 6 is a circuit diagram illustrating an example of the configuration of a voltage monitoring block included in a semiconductor device according to Embodiment 2 of the present invention. The voltage monitoring block VMBK illustrated in FIG. 6 extends the example of the configuration illustrated in FIG. 1, employing the configuration in which multiple (two in the present example) input voltages Vin[1] and Vin[2] are monitored. The voltage monitoring block VMBK concerned includes voltage detection units VDETU[1] and VDETU[2] that detect the magnitude of the input voltages Vin[1] and Vin[2], respectively, and a bias voltage generating circuit VBSG provided in common for the voltage detection units.

As is the case with FIG. 1, the voltage detection unit VDETU[1] includes voltage detection circuits VDET1[1]-VDET3[1], and a resistive subdivision circuit RDIV[1] to which the input voltage Vin[1] is applied. nMOS transistors MN11-MN13 in the voltage detection circuits VDET1[1]-VDET3[1] are driven respectively by subdivided input voltages Vi1[1]-Vi3[1] from the resistive subdivision circuit RDIV[1]. In the same manner, the voltage detection unit VDETU[2] includes voltage detection circuits VDET1 [2]-VDET3 [2], and a resistive subdivision circuit RDIV[2] to which the input voltage Vin[2] is applied. nMOS transistors MN21-MN23 in the voltage detection circuits VDET1[2]-VDET3[2] are driven respectively by subdivided input voltages Vi1[2]-Vi3 [2] from the resistive subdivision circuit RDIV[2].

As is the case with the bias generating circuit BSG illustrated in FIG. 1, the bias voltage generating circuit VBSG includes a pMOS transistor MP0 and an nMOS transistor MN0 and generates a bias voltage Vbias. The bias voltage Vbias concerned is applied in common to the pMOS transistors MP11-MP13 in the voltage detection circuits VDET1 [1]-VDET3 [1], and to the pMOS transistors MP21-MP23 in the voltage detection circuits VDET1[2]-VDET3 [2]. The voltage monitoring block VMBK concerned can include three or more voltage detection units in a similar manner.

<<The Outline Configuration of a Semiconductor Device>>

Figure 7:
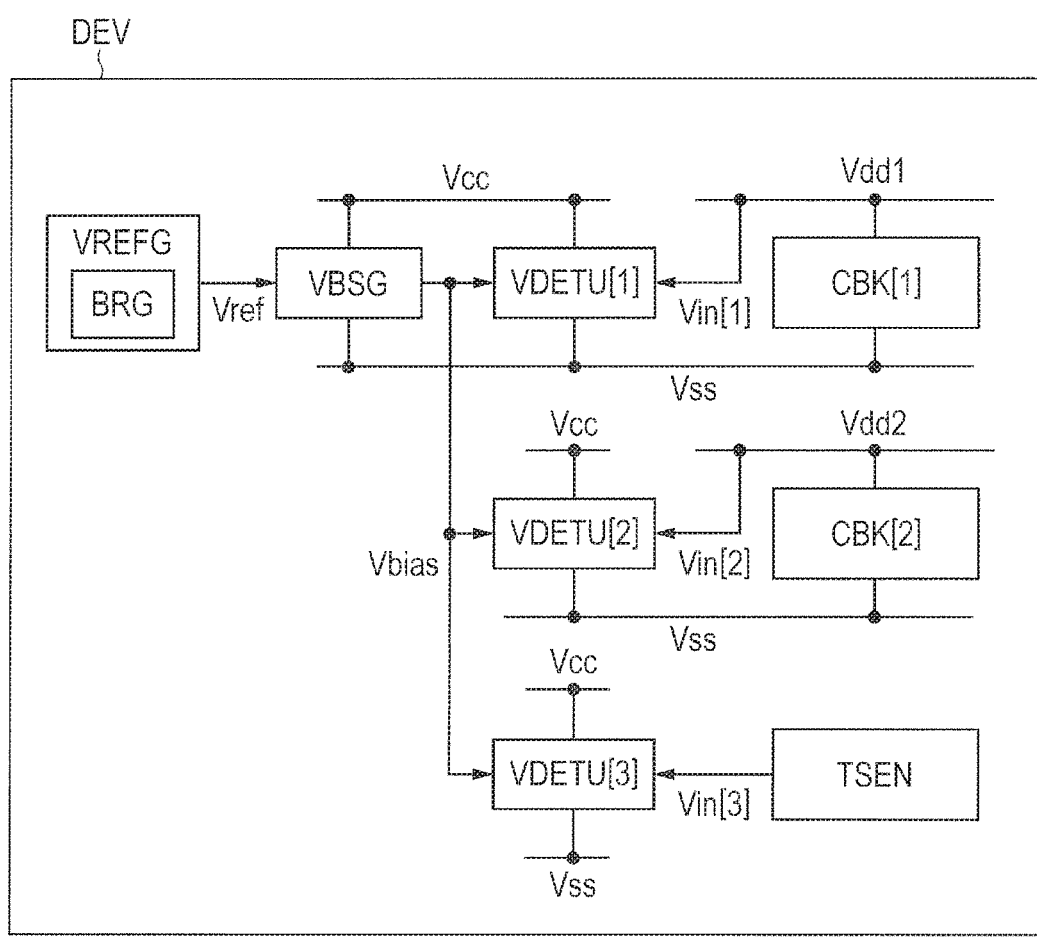
FIG. 7 is a schematic diagram illustrating an example of the configuration of a semiconductor device provided with the voltage monitoring block illustrated in FIG. 6.

FIG. 7 is a schematic diagram illustrating an example of the configuration of a semiconductor device provided with the voltage monitoring block illustrated in FIG. 6. In recent years, a semiconductor device (semiconductor chip) is provided with multiple power supplies in many cases. Specifically, for example, there are cases where a power supply system is subdivided or a power supply for a high-speed interface is separated, for the purpose of speeding up or low power consumption. In particular, in a semiconductor device of a vehicle application with high reliability requirements, monitoring such multiple power supplies individually is often required. Moreover, some semiconductor devices are provided with a single or multiple temperature sensors to furnish protection against temperature. FIG. 7 illustrates an example of such a semiconductor device.

The semiconductor device DEV illustrated in FIG. 7 is comprised of one semiconductor chip, for example, and includes a reference voltage generating circuit VREFG, a bias voltage generating circuit VBSG, multiple (three in the present example) voltage detection units VDETU[1]-VDETU[3], multiple circuit blocks CBK [1] and CBK [2], and a temperature sensor TSEN. The circuit blocks CBK[1] and CBK[2] operate by the internal power supplies Vdd1 and Vdd2, respectively, and realize predetermined user function. In some cases, the internal power supplies Vdd1 and Vdd2 are generated by a power regulator (not shown) for example, or in other cases, the external power inputted from the exterior of the chip is diverted as the internal power supply as it is.

The temperature sensor TSEN detects the temperature of the semiconductor chip, and outputs, for example, a voltage with a positive temperature characteristic (a PTAT (Proportional To Absolute Temperature) voltage) or a voltage with a negative temperature characteristic (a CTAT (Complementary to Absolute Temperature) voltage). The reference voltage generating circuit VREFG includes a band gap reference circuit BGR that generates a band gap voltage, and generates a reference voltage Vref using the band gap voltage concerned. Without providing the temperature sensor TSEN separately, the reference voltage generating circuit VREFG may output the PTAT voltage or the CTAT voltage, thereby entrusting the function as the temperature sensor TSEN to the reference voltage generating circuit VREFG. The power supply Vcc in FIG. 7 is supplied as an external power from the exterior of the chip, for example.

The voltage detection unit VDETU[1] detects the voltage level of the internal power supply Vdd1 as the input voltage Vin[1], and the voltage detection unit VDETU[2] detects the voltage level of the internal power supply Vdd2 as the input voltage Vin[2]. On the other hand, the voltage detection unit VDETU[3] detects the voltage level of the PTAT voltage or the CTAT voltage supplied from the temperature sensor TSEN as the input voltage Vin[3]. In this case, multiple comparison voltages (Vcp illustrated in FIG. 2) provided in the voltage detection unit VDETU[3] are set up in advance as voltages corresponding to the predetermined temperature, respectively. Accordingly, the voltage detection unit VDETU[3] can detect the range of the temperature of the semiconductor chip, for example. Then, the semiconductor device DEV can perform proper control (for example, to furnish protection against temperature by shifting to a low-power consumption mode etc.), according to the detection result of the voltage detection unit VDETU[3].

<<Details of the Band Gap Reference Circuit>>

Figure 8A:
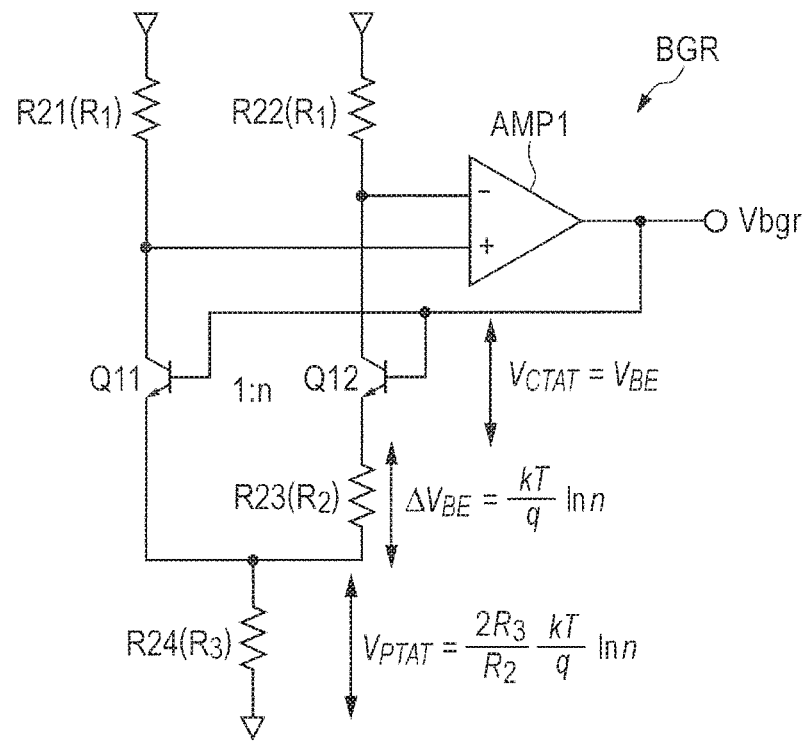
FIG. 8A and FIG. 8B are circuit diagrams illustrating examples of respectively different configurations and operations of the band gap reference circuit illustrated in FIG. 7.
Figure 8B:
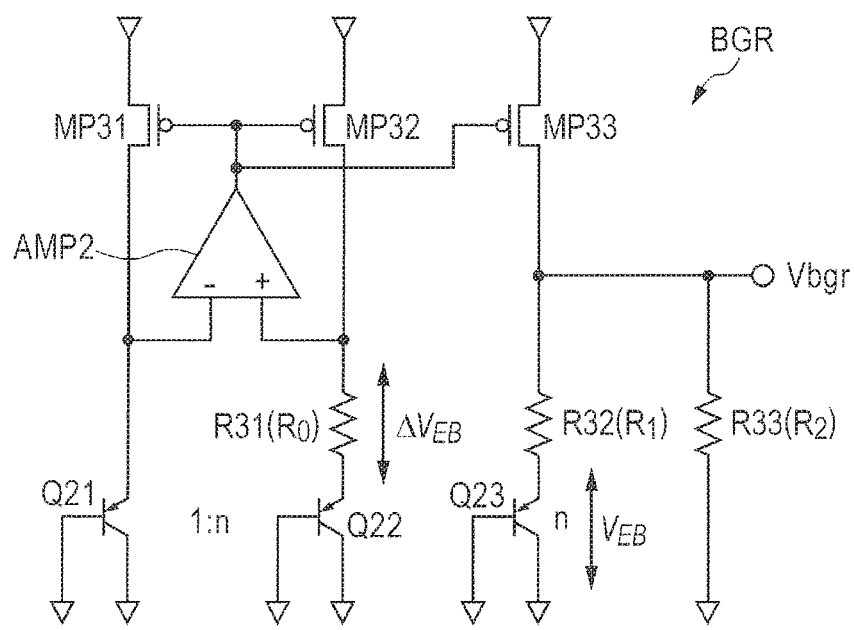

FIG. 8A and FIG. 8B are circuit diagrams illustrating examples of respectively different configurations and operations of the band gap reference circuit illustrated in FIG. 7. In the band gap reference circuit BGR illustrated in FIG. 8A, the size ratio of bipolar transistors Q11 and Q12 is set as 1:n, and a control loop is built so as to equalize the (+) input and the (−) input of an amplifier circuit AMP1 at the same potential.

Accordingly, a difference voltage $\Delta V_{BE}$ having a positive temperature characteristic is induced across both ends of a resistive element R23. On the other hand, a base-emitter voltage $V_{BE}$ of a bipolar transistor Q12 (Q11) has a negative temperature characteristic. By adding these two temperature characteristics, a band gap voltage Vbgr having a predetermined temperature characteristic as expressed by Equation (4) is generated. In Equation (4), "$R_2$" and "$R_3$" are the values of resistance of the resistive elements R23 and R24, respectively, and "kT/q" is the thermal voltage proportional to temperature "T."

$$Vbgr = V_{BE} + (2R_3/R_2)(kT/q)\ln(n) \tag{4}$$

Specifically, an electric current of the same value flows through the resistive elements R21 and R22. Therefore, an electric current twice the electric current, determined by the value of resistance "R2" of the resistive element R23 and the difference voltage $\Delta V_{BE}$, flows through the resistive element R24. As a result, the PTAT voltage $V_{PTAT}$ having a positive temperature characteristic is generated across both ends of the resistive element R24. By adding the base-emitter voltage $V_{BE}$ (that is, the CTAT voltage $V_{CTAT}$) of the bipolar transistor Q12 (Q11) to the PTAT voltage $V_{PTAT}$ concerned, the band gap voltage Vbgr as expressed by Equation (4) is generated.

In the same manner, in the band gap reference circuit BGR illustrated in FIG. 8B, the size ratio of bipolar transistors Q21 and Q22 is set as 1:n, and a control loop is built so as to equalize the (+) input and the (−) input of an amplifier circuit AMP2 at the same potential. Accordingly, a difference voltage $\Delta V_{BE}$ having a positive temperature characteristic is induced across both ends of a resistive element R31. The electric current determined by this difference voltage $\Delta V_{BE}$ and the value of resistance "$R_0$" of the resistive element R31 is mirrored to the pMOS transistor MP33. A part of this mirror current flows through the resistive element R32, and accordingly, the PTAT voltage having a positive temperature characteristic is generated across both ends of the resistive element R32.

By adding the emitter-base voltage $V_{EB}$ (that is, the CTAT voltage) of the bipolar transistor Q23 to the PTAT voltage concerned, the band gap voltage Vbgr with a predetermined temperature characteristic as expressed by Equation (5) is generated. In Equation (5), "R1" and "R2" are the values of resistance of the resistive elements R32 and R33, respectively, and "kT/q" is the thermal voltage proportional to temperature "T."

$$Vbgr = \{R_2/(R_1+R_2)\}\{V_{EB} + (R_1/R_0)(kT/q)\ln(n)\} \tag{5}$$

Specifically, the addition current of the electric current "(Vbgr−$V_{EB}$)/$R_1$" flowing through the resistive element R32 and the electric current "Vbgr/$R_2$" flowing through the resistive element R33 matches with the mirror current, and accordingly, the band gap voltage Vbgr as expressed by Equation (5) is generated.

As the band gap reference circuit BGR, various circuits typified by the circuits as illustrated in FIG. 8A and FIG. 8B are known. Even when any band gap reference circuit is used, usually, the band gap voltage Vbgr is generated by adding the PTAT voltage and the CTAT voltage at a predetermined ratio. In this case, ordinarily in order to minimize the temperature dependence of the band gap voltage Vbgr, the band gap reference circuit is designed so that the temperature characteristic of the CTAT voltage and the temperature characteristic of the PTAT voltage may offset each other. For example, in the band gap reference circuit BGR illustrated in FIG. 8A, the values of resistance "$R_2$" and "$R_3$" are determined so that the positive temperature characteristic and the negative temperature characteristic may offset each other.

The temperature sensor TSEN illustrated in FIG. 7 can generate the PTAT voltage or the CTAT voltage, by using the similar circuit as (or a part of) such a band gap reference circuit BGR (not shown).

<<The Layout Configuration of the Voltage Monitoring Block>>

FIG. 9 is a plan view illustrating an example of the layout configuration of a part of the voltage monitoring block illustrated in FIG. 6. FIG. 9 illustrates an example of the configuration of the bias voltage generating circuit VBSG and the voltage detection circuits VDET1[1]-VDET3[1], and VDET1[2]-VDET3[2] illustrated in FIG. 6. As is the case with FIG. 4, the pMOS transistors MP11-MP13 in the voltage detection circuits VDET1[1]-VDET3[1] are arranged collaterally in the X-axis direction in the pMOS forming region ARp. Furthermore, here, the pMOS transistors MP21-MP23 in the voltage detection circuits VDET1[2]-VDET3[2] are also arranged collaterally in the X-axis direction in the pMOS forming region ARp.

In the same manner, the nMOS transistors MN11-MN13 in the voltage detection circuits VDET1[1]-VDET3[1] are arranged collaterally in the X-axis direction in the nMOS forming region ARn. Furthermore, here, the nMOS transistors MN21-MN23 in the voltage detection circuits VDET1[2]-VDET3[2] are also arranged collaterally in the X-axis direction in the nMOS forming region ARn.

Then, the pMOS transistor MP0 in the bias voltage generating circuit VBSG is arranged between the row of the pMOS transistors MP11-MP13 and the row of the pMOS transistors MP21-MP23 in the pMOS forming region ARp. In the same manner, the nMOS transistor MN0 in the bias voltage generating circuit VBSG is arranged between the row of the nMOS transistors MN11-MN13 and the row of the nMOS transistors MN21-MN23 in the nMOS forming region ARn. By arranging the bias voltage generating circuit VBSG near the center in this way, the current mirror wiring to each of the voltage detection units VDETU[1] and VDETU[2] becomes short. Therefore, as is the case with FIG. 4, the voltage drop in the current mirror wiring is suppressed, leading to the improvement of the voltage detection precision.

The Main Effects of Embodiment 2

In the above, by employing the semiconductor device according to Embodiment 2, it is possible to obtain more notably the reduction effect of the circuit area and the power consumption, in addition to the various effects described in Embodiment 1. That is, the bias voltage generating circuit VBSG can be used in common for multiple input voltages Vin. Therefore, the more prominent effect is obtained as the number of input voltages Vin increases.

Embodiment 3

<<The Configuration of the Voltage Monitoring Block>>

Figure 10:
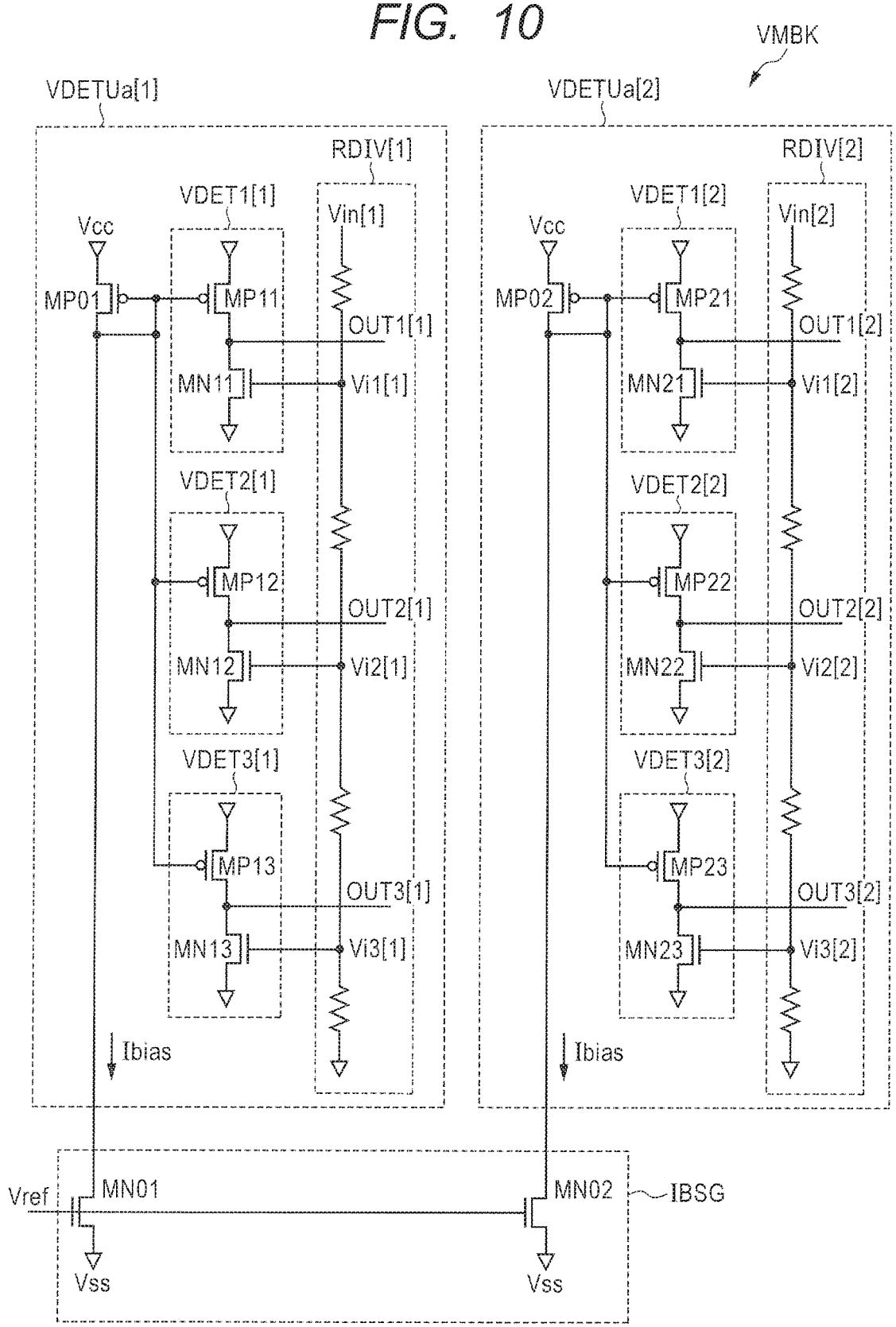
FIG. 10 is a circuit diagram illustrating an example of the configuration of a voltage monitoring block included in a semiconductor device according to Embodiment 3 of the present invention.

FIG. 10 is a circuit diagram illustrating an example of the configuration of a voltage monitoring block included in a semiconductor device according to Embodiment 3 of the present invention. The voltage monitoring block VMBK illustrated in FIG. 10 is different from the example of the configuration illustrated in FIG. 6 in the following point. First, the pMOS transistor MP0 illustrated in FIG. 6 is provided in each of voltage detection units VDETUa[1] and VDETUa[2]. That is, voltage detection units VDETUa[1] and VDETUa[2] include respectively pMOS transistors MP01 and MP02, corresponding to the pMOS transistor MP0 concerned.

Accordingly, in place of the bias voltage generating circuit VBSG illustrated in FIG. 6, a bias current generating circuit IBSG is provided for supplying a bias current Ibias to the pMOS transistors MP01 and MP02, respectively. In the present example, the bias current generating circuit IBSG includes two nMOS transistors MN01 and MN02 corresponding to the nMOS transistor MN0 illustrated in FIG. 6. Both nMOS transistors MN01 and MN02 receive the reference voltage Vref and supply the bias current Ibias to the pMOS transistors MP01 and MP02, respectively.

<<The Outline Configuration of the Semiconductor Device>>

Figure 11:
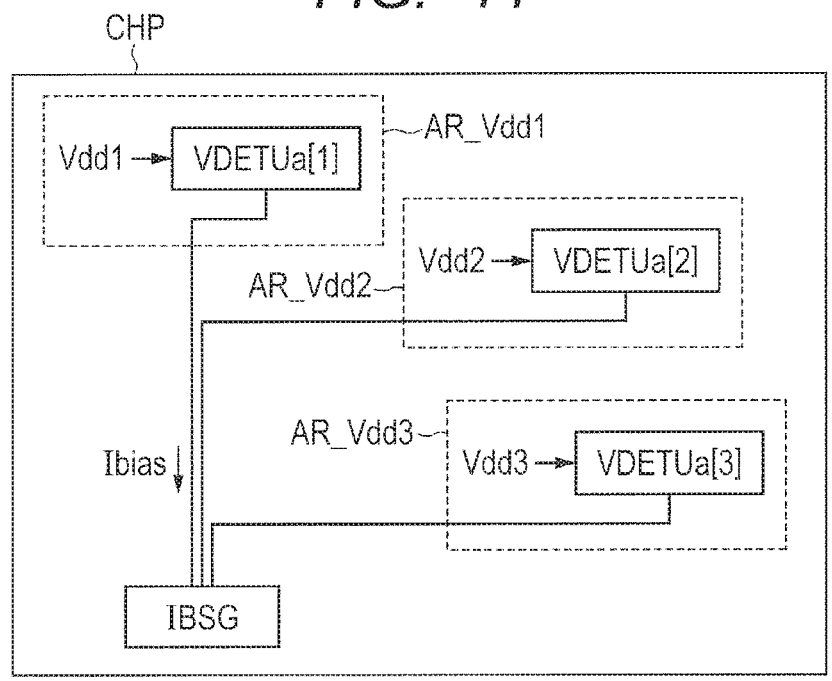
FIG. 11 is a schematic diagram illustrating an example of the arrangement configuration of a voltage monitoring block in a semiconductor device provided with the voltage monitoring block illustrated in FIG. 10.

FIG. 11 is a schematic diagram illustrating an example of the arrangement configuration of the voltage monitoring block in a semiconductor device provided with the voltage monitoring block illustrated in FIG. 10. The semiconductor device (a semiconductor chip CHP) illustrated in FIG. 11 includes multiple (three in the present example) power supply areas AR_Vdd1, AR_Vdd2, and AR_Vdd3. Circuit blocks that operate by the internal power supply Vdd1 are arranged in the power supply area AR_Vdd1. The internal power supply Vdd1 itself is supplied from an external power terminal or a power regulator arranged in the power supply area AR_Vdd1. Here, in order to detect the internal power supply Vdd1 with a high degree of accuracy, the corresponding voltage detection unit VDETUa[1] is arranged in the power supply area AR_Vdd1.

In the same manner, circuit blocks that operate by the internal power supply Vdd2 are arranged in the power supply area AR_Vdd2. In order to detect the internal power supply Vdd2 with a high degree of accuracy, the corresponding voltage detection unit VDETUa[2] is arranged in the power supply area AR_Vdd2. Also in the same manner, circuit blocks that operate by the internal power supply Vdd3 are arranged in the power supply area AR_Vdd3. In order to detect the internal power supply Vdd3 with a high degree of accuracy, the corresponding voltage detection unit VDETUa[3] is arranged in the power supply area AR_Vdd3.

Here, the power regulator that generates the internal power supplies Vdd1, Vdd2, and Vdd3 may be arranged in various parts in the chip. Even when the internal power supplies Vdd1, Vdd2, and Vdd3 are supplied from the external power terminal, the supply point may be distributed in various parts in the chip, in particular in a flip chip. Consequently, it is desirable to arrange the voltage detection units VDETUa[1]-VDETUa[3] in various points in the chip in a distributed manner.

Under the circumstances, when the example of the configuration as illustrated in FIG. 6 described in Embodiment 2 is used, for example, the bias voltage Vbias is supplied via long distance wiring. Therefore, it is likely that there arise variations in the bias current Ibias supplied to each voltage detection unit, due to the voltage drop by a wiring resistance. When the example of the configuration as illustrated in FIG. 10 is used, on the other hand, not the bias voltage Vbias but the bias current Ibias is supplied via long distance wiring. Therefore, the variations in the bias current Ibias supplied to each voltage detection unit can be reduced. Consequently, it is possible to achieve the improvement in the voltage detection precision.

The bias current Ibias is generated using the reference voltage Vref, and the reference voltage Vref is generated using the band gap reference circuit, as described in Embodiment 2. In order to reduce the circuit area, it is desirable to provide one piece of the band gap reference circuit at one point for example, rather than to provide several pieces at various points in the chip. The bias current generating circuit IBSG illustrated in FIG. 11 is arranged in proximity to the forming region of the band gap reference circuit. Accordingly, the bias current generating circuit IBSG can receive the reference voltage Vref without a voltage drop, and can generate multiple systems of the bias currents Ibias (three systems in FIG. 11) with a high degree of accuracy.

<<The Layout Configuration of the Voltage Detection Unit>>

Figure 12:
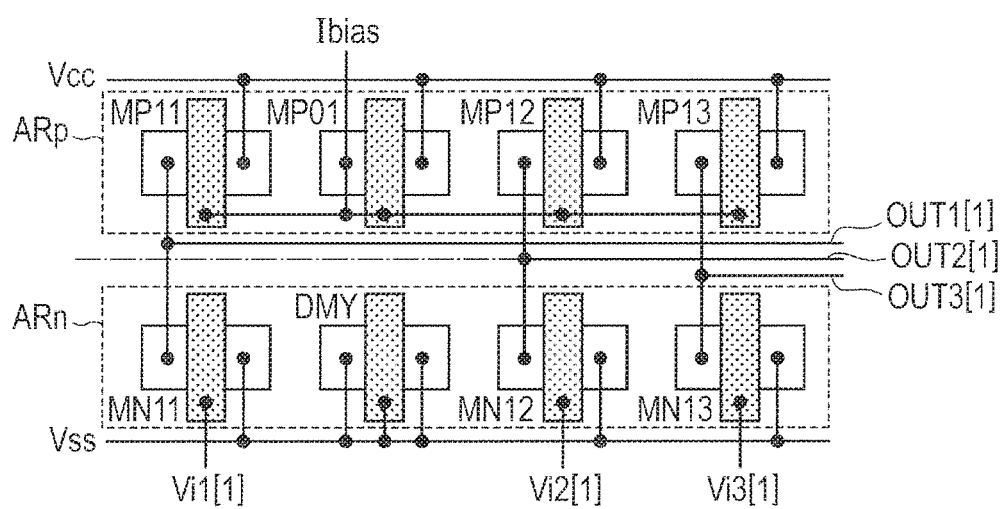
FIG. 12 is a plan view illustrating an example of the layout configuration of the voltage detection unit illustrated in FIG. 10.

FIG. 12 is a plan view illustrating an example of the layout configuration of the voltage detection unit illustrated in FIG. 10. FIG. 12 illustrates an example of the configuration of the voltage detection unit VDETUa[1] (excluding the resistive subdivision circuit RDIV[1]) illustrated in FIG. 10. The example of the layout configuration illustrated in FIG. 12 is almost same as the example of the configuration illustrated in FIG. 4. However, unlike the case illustrated in FIG. 4, a dummy transistor DMY is arranged within the row of the nMOS transistors MN11-MN13 in the nMOS forming region ARn. The dummy transistor DMY concerned is arranged instead of the nMOS transistor MN0 in FIG. 4. Accordingly, as is the case with FIG. 4, it is possible to reduce the manufacturing variations by shortening the wire length and maintaining the regularity of the layout.

The Main Effects of Embodiment 3

In the above, by employing the semiconductor device according to Embodiment 3, it is possible to attain improvement in the voltage detection precision, even when the voltage detection blocks are arranged in various points in the semiconductor chip, in addition to the various effects described in Embodiment 2.

Embodiment 4

<<The Configuration and Operation of the Voltage Monitoring Block>>

Figure 13:
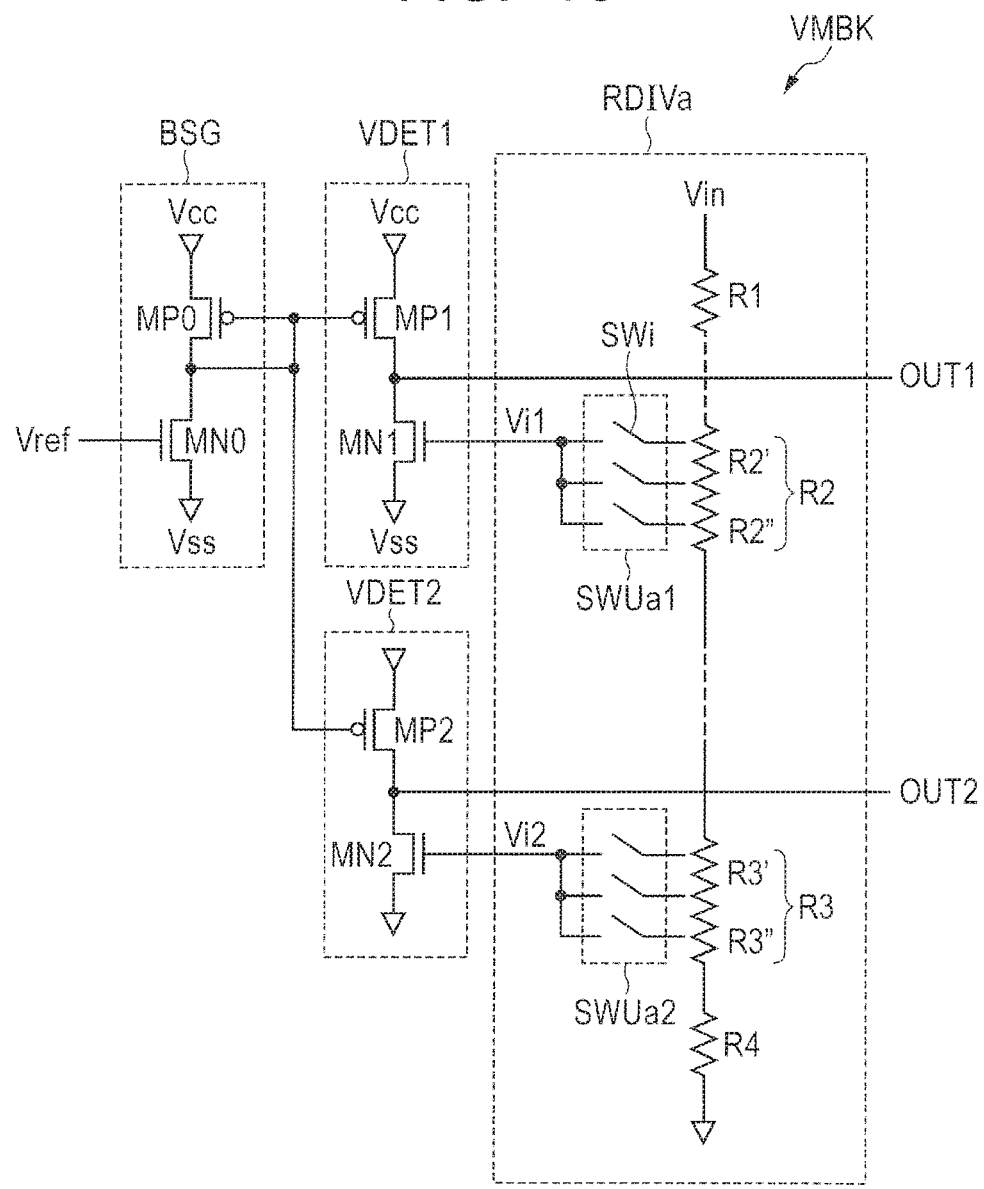
FIG. 13 is a circuit diagram illustrating an example of the configuration of a voltage monitoring block included in a semiconductor device according to Embodiment 4 of the present invention.

FIG. 13 is a circuit diagram illustrating an example of the configuration of a voltage monitoring block included in a semiconductor device according to Embodiment 4 of the present invention. The voltage monitoring block VMBK illustrated in FIG. 13 is different from the example of the configuration illustrated in FIG. 1 in that multiple switch units SWUa1 and SWUa2 are included in the resistive subdivision circuit RDIVa. Here, the voltage detection circuit VDET3 illustrated in FIG. is omitted for the sake of the simplification of the explanation. The switch units SWUa1 and SWUa2 function as a subdivided input voltage adjusting circuit. The subdivided input voltage adjusting circuit adjusts the magnitude of the subdivided input voltages Vi1 and Vi2 that drive at least one of the nMOS transistors MN1 and MN2, by selecting multiple input switches SWi coupled to multiple resistive subdivision nodes of an input ladder resistor (R1-R4).

In the present example, the multiple input switches SWi in the switch unit SWUa1 couple each of the multiple resistive subdivision nodes in the resistive element R2 to a drive node of the nMOS transistor MN1. In the same manner, the multiple input switches SWi in the switch unit SWUa2 couple each of the multiple resistive subdivision nodes in the resistive element R3 to a drive node of the nMOS transistor MN2. For example, by selecting any one of the multiple input switches SWi in the switch unit SWUa1, the resistive subdivision ratio of the sub-resistor element R2' and the sub-resistor element R2" that configure the resistive element R2 is adjusted; accordingly, the magnitude of the subdivided input voltage Vi1 is also adjusted. Consequently, for example, the comparison voltage Vcp1 of the voltage detection circuit VDET1 is given by Equation (6).

$$Vcp1=\{(R1+R2+R3+R4)/(R2"+R3+R4)\} \times Vref \quad (6)$$

Here, the adjustment of the subdivided input voltage (Vi) (that is, the comparison voltage (Vcp)) is performed when any one of Case (A)-Case (C) in the following occurs, for example. Case (A) is a case where the difference in an electrical characteristic occurs due to manufacturing variations, typified by a case where the threshold voltage (Vth) variations occur between the nMOS transistors MN1 and MN2, and a case where the Vth variations occur between the nMOS transistor MN0 and the nMOS transistors MN1 and/or MN2. When the Vth variations occur, a desired electric current does not flow through each transistor, leading to the equivalent deviation of the reference voltage Vref in Equation (6). Case (B) is a case where temperature dependence occurs in the reference voltage Vref. The deviation of the reference voltage Vref in Case (A) and Case (B) can be compensated by the adjustment of the value of resistance (R2") in Equation (6).

Regarding Case (A), for example, at the time of the test after manufacturing the device, the input switch SWi to be controlled to ON in the switch unit SWUa1 may be determined immovably, so that the output signal OUT1 makes a transition by the target input voltage Vin. The same applies to the input switch SWi in the switch unit SWUa2. Regarding Case (B), for example, a temperature sensor may be mounted in the semiconductor device, and the input switch SWi to be controlled to ON in each of the switch units SWUa1 and SWUa2 may be dynamically switched based on the detection result of the temperature sensor concerned.

Figure 14:
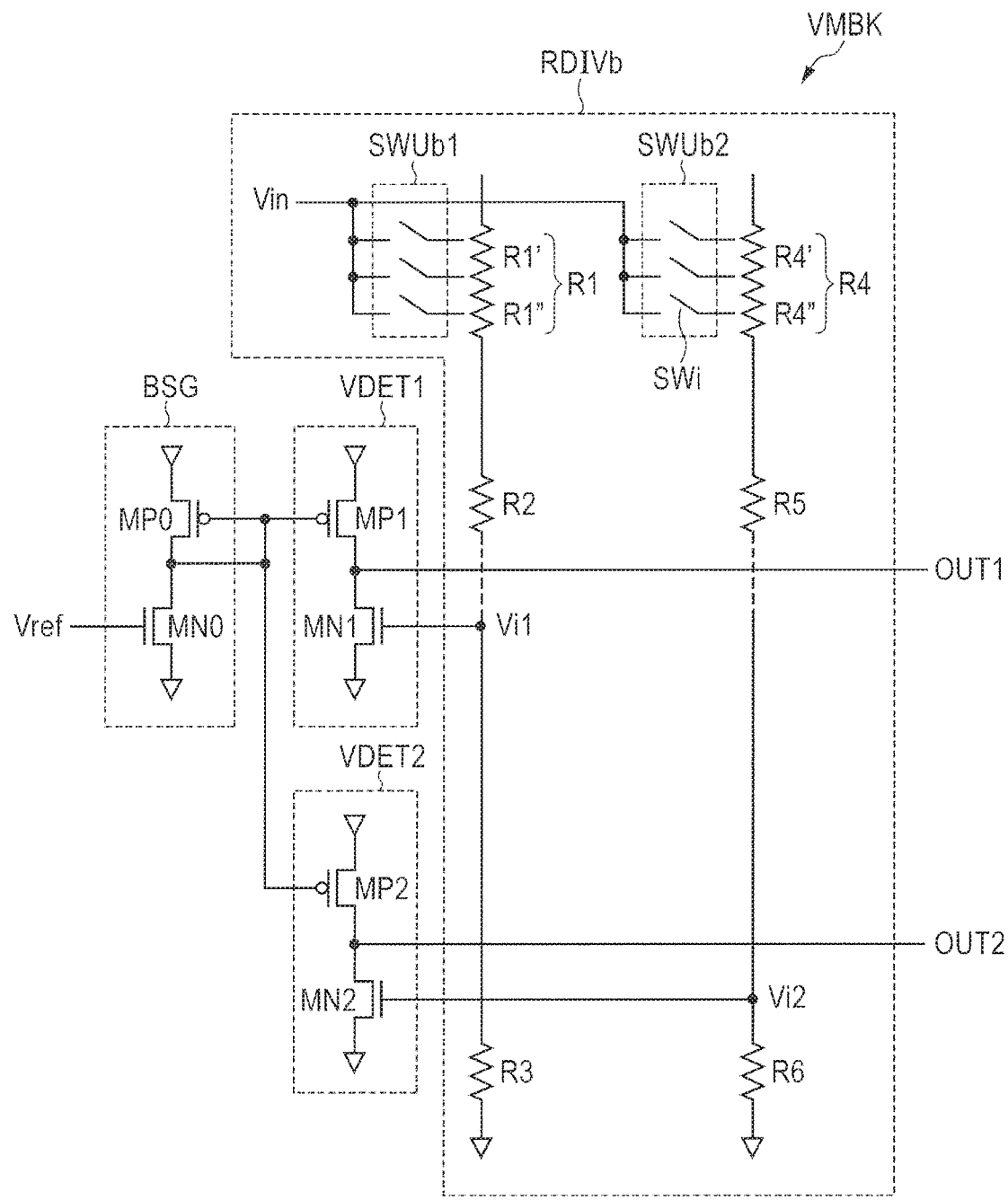
FIG. 14 is a circuit diagram illustrating an example of the configuration of a voltage monitoring block different from that illustrated in FIG. 13.

Case (C) is a case where modification of the specification itself of the comparison voltage is required according to the requirement of the system. In this case, all of the subdivided input voltages Vi1 and Vi2 do not need to be adjustable, however, a part of the subdivided input voltages Vi1 and Vi2 needs to be adjustable, based on the requirement of the system, FIG. 14 is a circuit diagram illustrating an example of the configuration of a voltage monitoring block different from that illustrated in FIG. 13. As is the case with FIG. 13, the voltage monitoring block VMBK illustrated in FIG. 14 includes the switch units SWUb1 and SWUb2 that function as a subdivided input voltage adjusting circuit, in the resistive subdivision circuit RDIVb. However, unlike the case illustrated in FIG. 13, the input ladder resistor is provided as many as the number of the voltage detection circuits VDET1 and VDET2. In the present example, an input ladder resistor (R1-R3) is provided corresponding to the nMOS transistor MN1 of the voltage detection circuit VDET1, and an input ladder resistor (R4-R6) is provided corresponding to the nMOS transistor MN2 of the voltage detection circuit VDET2.

The switch unit SWUb1 couples selectively the input voltage Vin to any one of the resistive subdivision nodes of the input ladder resistor (R1-R3). In the same manner, the switch unit SWUb2 couples selectively the input voltage Vin to any one of the resistive subdivision nodes of the input ladder resistor (R4-R6). In the present example, the input voltage Vin is coupled selectively to one of the resistive subdivision nodes included in the resistive element R1 in the input ladder resistor (R1-R3), and is coupled selectively to one of the resistive subdivision nodes included in the resistive element R4 in the input ladder resistor (R4-R6).

The drive node of the nMOS transistor MN1 is coupled immovably to any one of the resistive subdivision nodes of the input ladder resistor (R1-R3) (here, the coupling node of the resistive element R2 and the resistive element R3). In the same manner, the drive node of the nMOS transistor MN2 is coupled immovably to any one of the resistive subdivision nodes of the input ladder resistor (R4-R6) (here, the coupling node of the resistive element R5 and the resistive element R6). For example, by selecting any one of the multiple input switches SWi in the switch unit SWUb1, the resistive subdivision ratio of the sub-resistor element R1' and the sub-resistor element R1" that configure resistive element R1 is adjusted; accordingly, the magnitude of the subdivided input voltage Vi1 is adjusted. Consequently, for example, the comparison voltage Vcp1 of the voltage detection circuit VDET1 is given by Equation (7).

$$Vcp1=\{(R1"+R2+R3)/R3\} \times Vref \quad (7)$$

In the example of the configuration illustrated in FIG. 13, the denominator changes as the value of the resistance (R2") changes as expressed by Equation (6); accordingly, the comparison voltage Vcp1 does not linearly follow the value of the resistance (R2"). Consequently, when it is needed to adjust the comparison voltage Vcp1 at equal intervals for example, it is necessary to provide the resistive subdivision nodes of the resistive element R2 at an unequal interval. On the other hand, in the example of the configuration illustrated in FIG. 14, the numerator changes as the value of the resistance (R1") changes as expressed by Equation (7); accordingly, the comparison voltage Vcp1 follows linearly the value of the resistance (R1"). Consequently, it is possible to provide the resistive subdivision nodes of the resistive element R1 at an equal interval, and for example, it is possible to form the resistive element R1 easily by arranging the same unit resistor elements in the shape of an array. However, in the example of the configuration illustrated in FIG. 14, the input ladder resistor is required as many as the number of the voltage detection circuits VDET1 and VDET2. Therefore, from the viewpoint of the circuit area, the example of the configuration illustrated in FIG. 13 is desirable.

Figure 15:
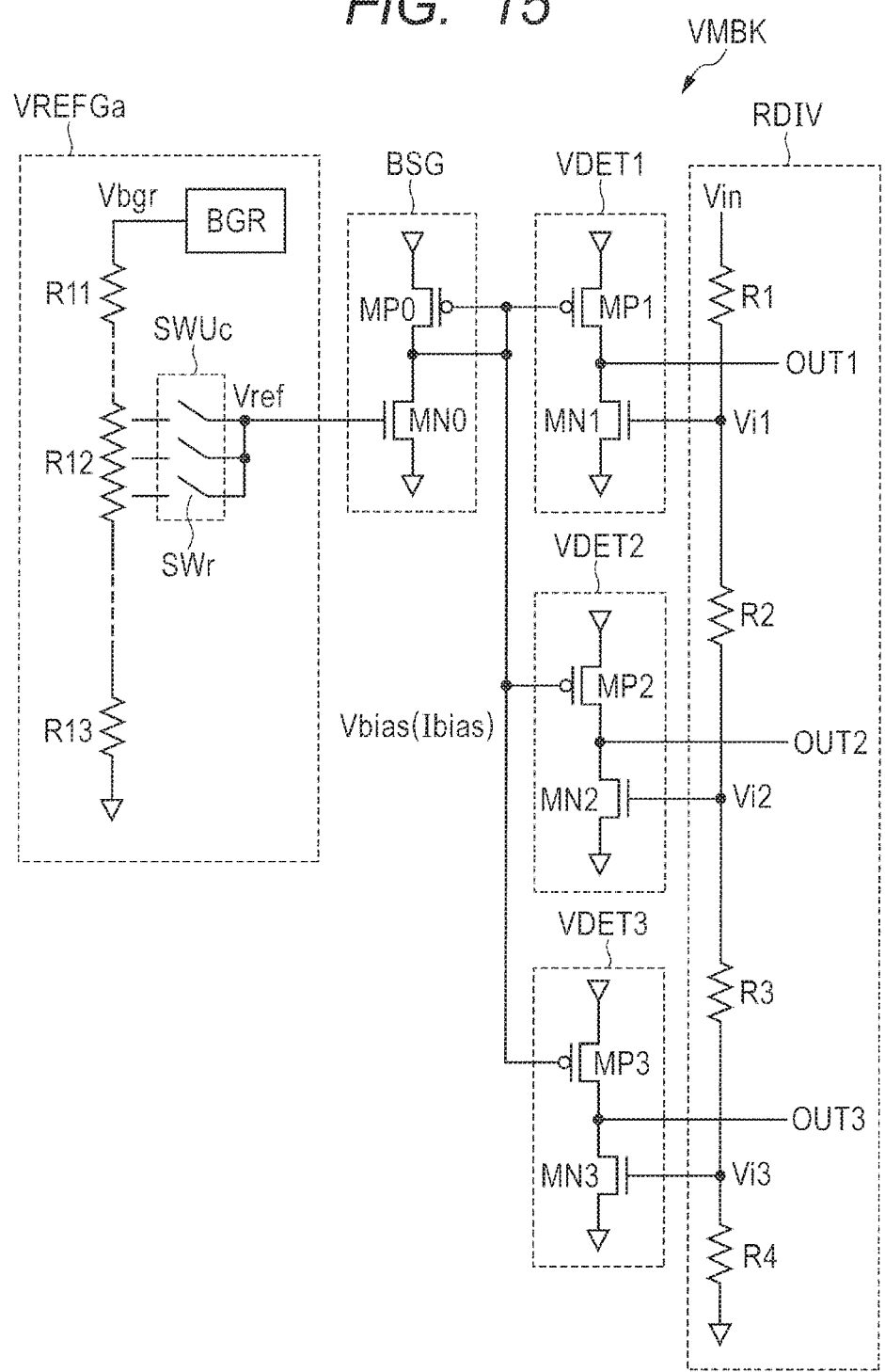
FIG. 15 is a circuit diagram illustrating another example of the configuration of the voltage monitoring block included in the semiconductor device according to Embodiment 4 of the present invention.

FIG. 15 is a circuit diagram illustrating another example of the configuration of the voltage monitoring block included in the semiconductor device according to Embodiment 4 of the present invention. The voltage monitoring block VMBK illustrated in FIG. 15 includes additionally a reference voltage generating circuit VREFGa that generates the reference voltage Vref, when compared with the example of the configuration illustrated in FIG. 1. The reference voltage generating circuit VREFGa includes a reference ladder resistor (R11-R13), a band gap reference circuit BGR, and a switch unit SWUc.

The band gap reference circuit BGR generates the band gap voltage Vbgr by adding the PTAT voltage and the CTAT voltage at a predetermined ratio, as described in FIG. 8A and FIG. 8B. The band gap reference circuit BGR applies the band gap voltage Vbgr concerned to the reference ladder resistor (R11-R13). The switch unit SWUc functions as a reference voltage adjusting circuit. The reference voltage adjusting circuit adjusts the magnitude of the reference voltage Vref, by selecting multiple reference switches SWr coupled to multiple resistive subdivision nodes of the reference ladder resistor (R11-R13). In the present example, the band gap voltage Vbgr is applied to one end of the reference ladder resistor (R11-R13), and the reference switch SWr couples each of the resistive subdivision nodes included in the resistive element R12 in the reference ladder resistor to the drive node of the nMOS transistor MN0.

When the threshold voltage (Vth) of the nMOS transistor MN0 produces variations, for example, the bias current Ibias based on the reference voltage Vref also produces variations, leading to the possibility of increase in the power consumption. When the reference voltage Vref has temperature dependence, it is likely that the voltage detection precision degrades and that the power consumption increases with the variations of the bias current Ibias.

Therefore, the switch unit SWUc shifts the reference voltage Vref to the low potential side, for example, when the threshold voltage (Vth) of the nMOS transistor MN0 is lower than the designed value, and the switch unit SWUc shifts the reference voltage Vref to the high potential side, when the Vth is higher than the designed value. That is, the switch unit SWUc determines the reference switch SWr to be controlled to ON so as to perform such a shift. The switch unit SWUc switches dynamically the reference switch SWr to be controlled to ON in response to changes in temperature so that the temperature dependence of the reference voltage Vref may be offset (that is, the reference voltage Vref may become always constant). Accordingly, it becomes possible to keep the power consumption constant in each semiconductor device (semiconductor chip), and it is possible to suppress the degradation of the voltage detection precision.

Figure 16:
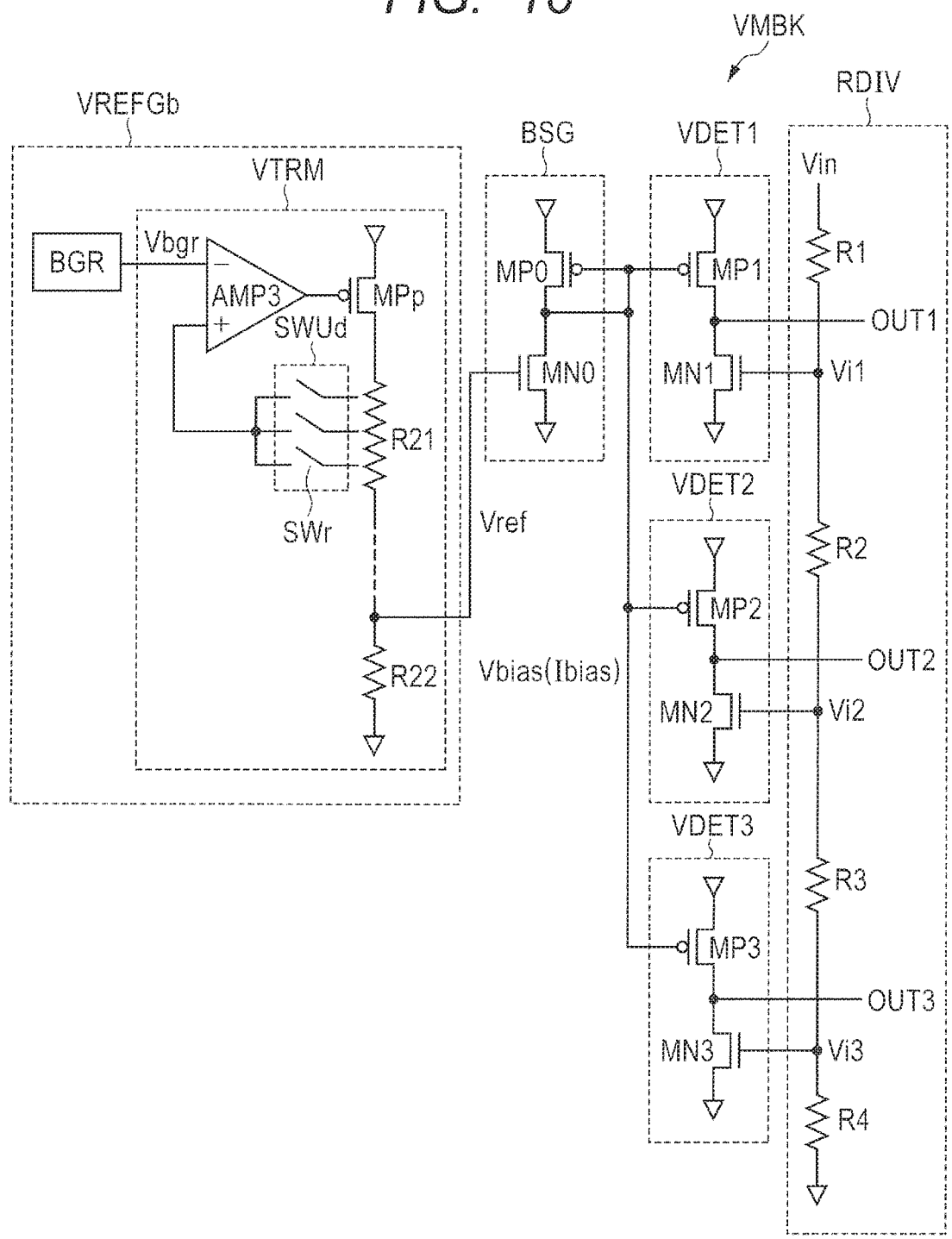
FIG. 16 is a circuit diagram illustrating an example of the configuration of a voltage monitoring block different from that illustrated in FIG. 15.

FIG. 16 is a circuit diagram illustrating an example of the configuration of a voltage monitoring block different from that illustrated in FIG. 15. Different from the example of the configuration illustrated in FIG. 15, the voltage monitoring block VMBK illustrated in FIG. 16 is provided with the reference voltage generating circuit VREFGb including a voltage trimming circuit VTRM with a switch unit SWUd. The switch unit SWUd functions as the reference voltage adjusting circuit, as is the case with FIG. 15. The voltage trimming circuit VTRM includes an amplifier circuit AMP3 that receives the band gap voltage Vbgr at the (−) input, a pMOS transistor MPp that is driven by the output voltage of the amplifier circuit AMP3, and a reference ladder resistor (R21, R22) that performs the resistive subdivision of the drain voltage thereof. The switch unit SWUd returns one of the resistive subdivision nodes included in the resistive element R21 to the (+) input of the amplifier circuit AMP3 via the selected reference switch SWr.

By such a negative feedback loop using the amplifier circuit AMP3, the voltage of the resistive subdivision node serving as the coupling point of the reference switch SWr controlled to ON is controlled by the band gap voltage Vbgr. When expressing in another way, the reference switch SWr couples the band gap voltage Vbgr selectively to one of the resistive subdivision nodes included in the resistive element R21 of the reference ladder resistor. The drive node of the nMOS transistor MN0 is coupled immovably to one of the resistive subdivision nodes of the reference ladder resistor (R21, R22) (the coupling node of the resistive element R21 and the resistive element R22 in the present example).

The example of the configuration illustrated in FIG. 15 adopts a system in which the band gap voltage Vbgr is fixed and the reference voltage Vref is adjusted by adjusting the resistive subdivision ratio for the band gap voltage Vbgr. On the other hand, the example of the configuration illustrated in FIG. 16 adopts, so to speak, a system in which the reference voltage Vref is adjusted by performing variable control of the band gap voltage Vbgr itself in the example of the configuration illustrated in FIG. 15, through the adjustment of the resistive subdivision ratio. Here, imagine a case where the reference voltage Vref is adjusted in units of 10 mV, for example.

In the system illustrated in FIG. 15, the unit resistor element corresponding to 10 mV concerned is required. On the other hand, in the system illustrated in FIG. 16, when the band gap voltage Vbgr is assumed to be divided to one half by the resistive subdivision, to generate the reference voltage Vref, it is only necessary to adjust the band gap voltage Vbgr in units of 20 mV and to provide the unit resistor element corresponding to 20 mV. In this way, as compared with the system illustrated in FIG. 15, in the system illustrated in FIG. 16, it is possible to make large the value of resistance of the unit resistor element, corresponding to the resistive subdivision ratio of the band gap voltage Vbgr and the reference voltage Vref. Therefore, it becomes possible to reduce the circuit area of the unit resistor element.

The Main Effects of Embodiment 4

In the above, by employing the semiconductor device according to Embodiment 4, it is possible to compensate the characteristic variations accompanying the manufacturing variations, the temperature dependence, etc., in addition to the various effects described in Embodiment 1, and it is possible to achieve the further improvement in the voltage detection precision. It is also possible to reduce the power consumption by the compensation of the variations.

Embodiment 5

<<The Configuration of the Voltage Monitoring Block>>

Figure 17:
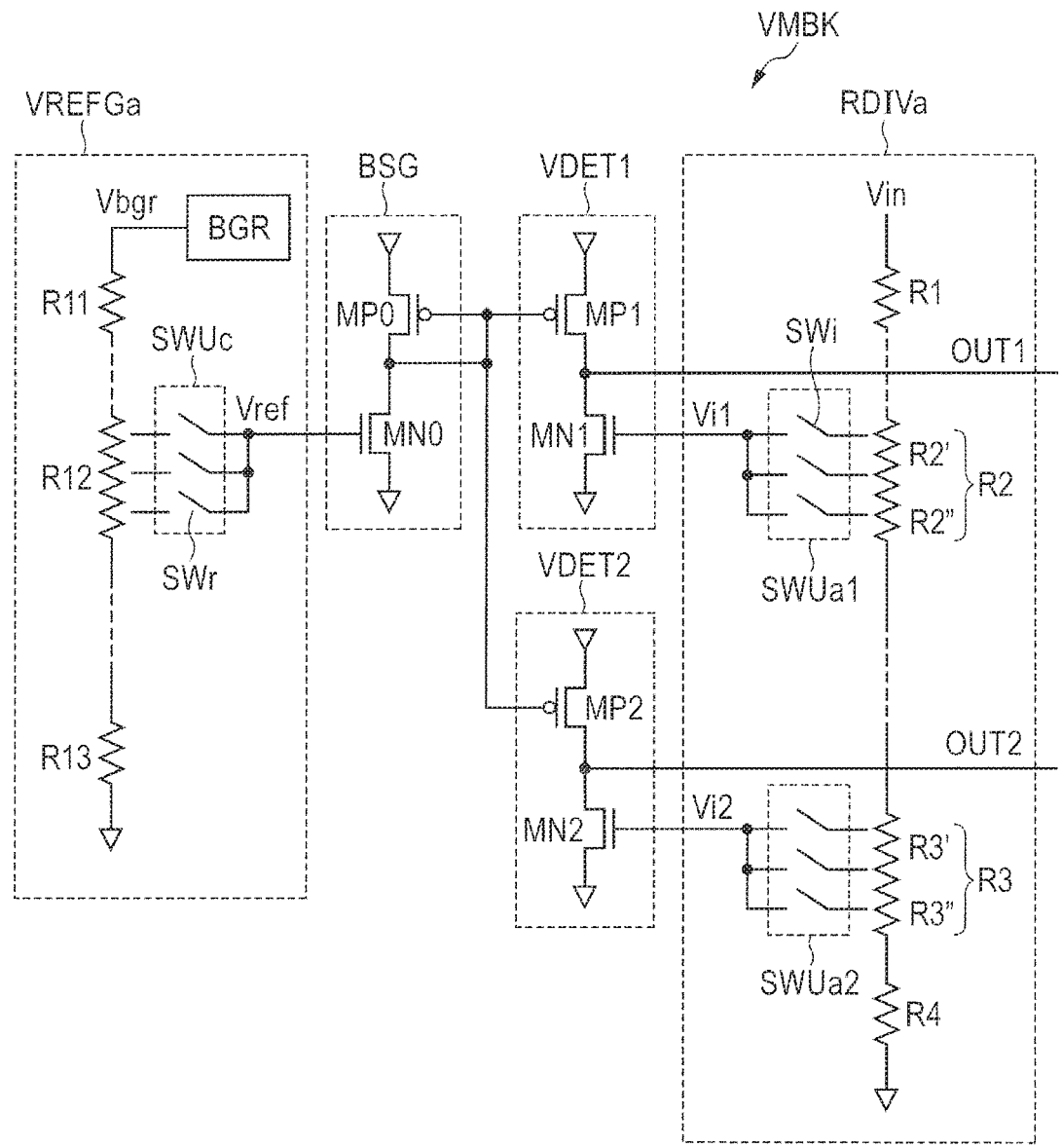
FIG. 17 is a circuit diagram illustrating an example of the configuration of a voltage monitoring block included in a semiconductor device according to Embodiment 5 of the present invention.

FIG. 17 is a circuit diagram illustrating an example of the configuration of a voltage monitoring block included in a semiconductor device according to Embodiment 5 of the present invention. The voltage monitoring block VMBK illustrated in FIG. 17 has the configuration in which the reference voltage generating circuit VREFGa illustrated in FIG. 15 is added to the example of the configuration illustrated in FIG. 13 including the resistive subdivision circuit RDIVa. Here, the example is the combination of FIG. 13 and FIG. 15. However, either of FIG. 13 and FIG. 14 and either of FIG. 15 and FIG. 16 may be combined.

When the resistive subdivision circuit RDIVa is used, it is possible to compensate the difference in the characteristics due to manufacturing variations as described in Embodiment 4. Specifically, it is possible to compensate the threshold voltage (Vth) variations between the nMOS transistors MN1 and MN2 and the Vth variations between the nMOS transistor MN0 and the nMOS transistors MN1 and/or MN2. Even in a case where the temperature dependence occurs in the reference voltage Vref, the temperature dependence concerned can be compensated in some cases, by switching dynamically each input switch SWi in the switch units SWUa1 and SWUa2, in response to changes in temperature. However, when both the compensation of the manufacturing variations and the compensation of the temperature dependence are performed in the resistive subdivision circuit RDIVa, it is likely that the control logic for selecting the input switch SWi becomes complicated.

Therefore, in FIG. 17, for example, the resistive subdivision circuit RDIVa compensates the manufacturing variations (specifically, the compensation of the threshold voltage (Vth) variations), and the reference voltage generating circuit VREFGa compensates the temperature dependence of the reference voltage Vref. Accordingly, the control logic for selecting the input switch SWi and the control logic for selecting the reference switch SWr can be formulated independently, without mutual interference. Therefore, it is possible to realize the facilitation of the control logic.

Figure 18:
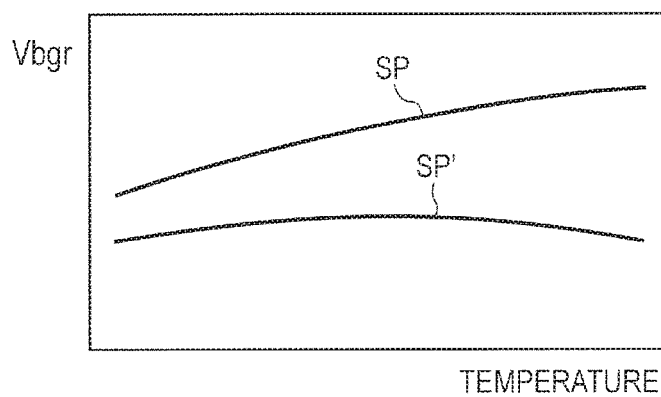
FIG. 18 is a drawing illustrating an example of the temperature characteristic of a band gap reference circuit included in a reference voltage generating circuit illustrated in FIG. 17.

FIG. 18 is a drawing illustrating an example of the temperature characteristic of the band gap reference circuit included in the reference voltage generating circuit illustrated in FIG. 17. In order to minimize the temperature dependence of the band gap voltage Vbgr as described in FIG. 8A and FIG. 8B, the band gap reference circuit BGR is designed ordinarily so as to offset the temperature characteristic of the PTAT voltage and the temperature characteristic of the CTAT voltage each other. However, strictly speaking, the band gap voltage Vbgr has a non-linear (second-order component) temperature characteristic SP', as illustrated in FIG. 18. This is because, referring to FIG. 8A as the example, the PTAT voltage $V_{PTAT}$ behaves linearly for temperature, however, the CTAT voltage $V_{CTAT}$ ($=V_{BE}$) is a function of a saturation current (Is) and behaves nonlinearly for temperature. Consequently, the temperature dependence occurs in the reference voltage Vref, leading to a possibility of degrading the voltage detection precision.

In order to increase the voltage detection precision, it is desirable to compensate such temperature dependence. However, it is not easy to compensate the nonlinear temperature characteristic SP' as illustrated in FIG. 18. Accordingly, as illustrated in FIG. 18, in order to make small the nonlinearity (second-order component) of the temperature characteristic, the band gap voltage Vbgr that has a slightly positive temperature characteristic SP is daringly used in Embodiment 5. That is, it is possible to improve the linearity of the temperature characteristic SP by designing the band gap reference circuit BGR so as to add the PTAT voltage and the CTAT voltage at a higher ratio of the PTAT voltage against the CTAT voltage. Consequently, it becomes possible to perform the temperature compensation by the linear interpolation and to realize the highly precise temperature compensation using the reference voltage generating circuit VREFGa as illustrated in FIG. 17.

The linearity of the temperature characteristic SP is improved as the ratio of the PTAT voltage against the CTAT voltage is increased (as the positive gradient of the temperature characteristic SP is enlarged). On the other hand, the compensation even for a small temperature change becomes necessary. Therefore, it is likely that the structure of the reference ladder resistor (R11-R13) and the switch unit SWUc becomes complicated. From such a viewpoint, about 0.05-0.2 mV/° C. is desirable as the gradient of a straight line that connects two points at −40° C. and 125° C. in the temperature characteristic SP.

<<The Outline Configuration of a Semiconductor Device>>

Figure 19:
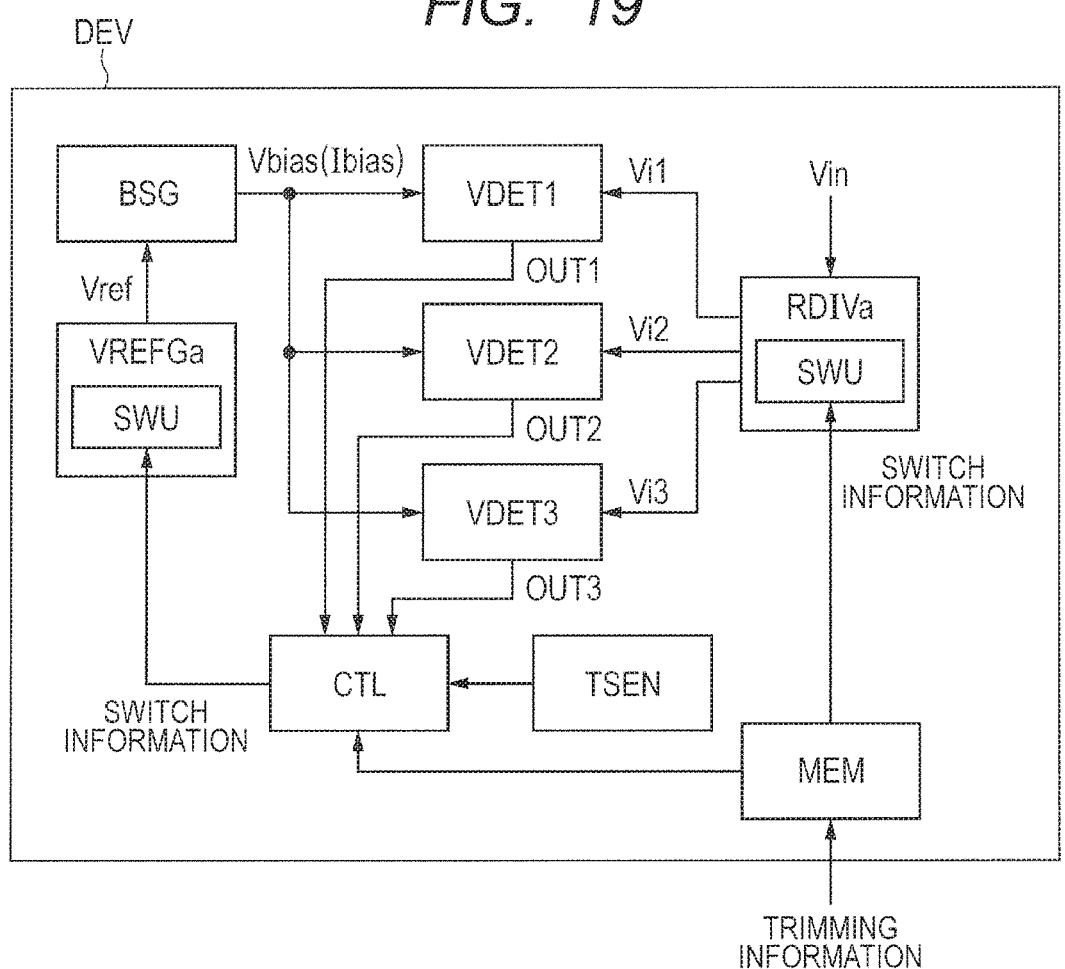
FIG. 19 is a schematic diagram illustrating an example of the configuration of a semiconductor device provided with the voltage monitoring block illustrated in FIG. 17.

FIG. 19 is a schematic diagram illustrating an example of the configuration of a semiconductor device provided with the voltage monitoring block illustrated in FIG. 17. The semiconductor device DEV illustrated in FIG. 19 is comprised of one semiconductor chip, for example, and includes a memory circuit MEM, a temperature sensor TSEN, and a control circuit CTL, in addition to the reference voltage generating circuit VREFGa, the bias generating circuit BSG, the voltage detection circuits VDET1-VDET3, and the resistive subdivision circuit RDIVa as illustrated in FIG. 17. The memory circuit MEM is a nonvolatile memory for example and holds the trimming information determined in advance. The switch unit SWU in the resistive subdivision circuit RDIVa selects a predetermined input switch SWi based on the trimming information (switch information) concerned.

The control circuit CTL generates switch information according to the trimming information of the memory circuit MEM and the detection result of the temperature sensor TSEN. The switch unit SWU in the reference voltage generating circuit VREFGa selects a predetermined reference switch SWr based on the switch information concerned. The control circuit CTL determines the voltage level of the input voltage Vin, based on the output signals OUT1-OUT3 from the voltage detection circuits VDET1-VDET3.

Here, the concrete example of the switch information is explained with reference to FIG. 17 and FIG. 19. Here, for the convenience of explanation, it is assumed that the semiconductor device DEV includes two voltage detection circuits VDET1 and VDET2. First, in the testing phase after manufacture of the semiconductor device DEV, the predetermined test equipment sets the reference switch SWr so that the bias current flowing through the nMOS transistor MN0 exhibits a desired value. Next, with the determined reference switch SWr concerned, the test equipment determines each input switch SWi in the switch units SWUa1 and SWUa2 so that the output signals OUT1 and OUT2 make a transition at the target input voltage Vin, as described in Embodiment 4. The test equipment records the switch information determined in this way to the memory circuit MEM as the trimming information.

Subsequently, at the time of the normal operation of the semiconductor device DEV, the switch unit SWU in the resistive subdivision circuit RDIVa controls the predetermined input switch SWi to ON, based on the trimming information of the memory circuit MEM. On the other hand, the control circuit CTL determines the reference switch SWr to be controlled to ON, according to the detection result of the temperature sensor TSEN, with a default of the reference switch SWr set based on the trimming information of the memory circuit MEM. The rule in this case (that is, how to change the reference switch SWr from the default according to the change of temperature) is determined in advance, based on the result of the simulation for example.

The temperature sensor TSEN may adopt the configuration as illustrated in FIG. 7 in Embodiment 2 in addition to the generally known configuration (for example, the configuration in which temperature is detected at a high resolution). That is, it is also preferable to adopt the configuration in which several groups of the voltage detection circuit and the resistive subdivision circuit are provided and using one of the groups, the voltage range of the PTAT voltage or the CTAT voltage (that is, the temperature range) is detected. In this case, the control circuit CTL may perform processing to change the reference switch SWr whenever the temperature range changes.

The Main Effects of Embodiment 5

In the above, by employing the semiconductor device according to Embodiment 5, it is possible to compensate the characteristic variations accompanying the manufacturing variations and the temperature dependence by using a simple device, in addition to the various effects described in Embodiment 4. By furnishing a positive temperature characteristic to the band gap voltage Vbgr, it is possible to compensate the temperature dependence of the reference voltage Vref with ease and with a high degree of accuracy, and it is possible to achieve the further improvement in the voltage detection precision.

As described above, the invention accomplished by the present inventors has been concretely explained based on the embodiments. However, the present invention is not restricted to the embodiments as described above, and it can be changed variously in the range which does not deviate from the gist. For example, the embodiments described above are explained in detail, in order to explain the present invention plainly, and it is not necessarily restricted to the embodiments in which all the explained configurations are included. It is possible to replace a part of the configuration of a certain embodiment with the configuration of other embodiment, and it is also possible to add the configuration of other embodiment to the configuration of a certain embodiment. It is possible to perform addition, deletion, and substitution of other configurations about a part of the configuration of each embodiment.

ADDITIONAL REMARK (1) A semiconductor device is comprised of:
a plurality of output nodes to output respectively comparison results between an input voltage and a plurality of comparison voltages;
a plurality of first transistors of a first conductive type coupled respectively between the output nodes and a first power supply;
a plurality of a second transistors of a second conductive type coupled respectively between the output nodes and a second power supply;
a resistive subdivision circuit to perform resistive subdivision of the input voltage by means of an input ladder resistor and to drive the second transistors respectively by a plurality of subdivided input voltages with different resistive subdivision ratios; and
a bias voltage generating circuit to generate a bias voltage and to drive the first transistors in common with the bias voltage.

(2) In the semiconductor device according to (1), the semiconductor device is comprised of one semiconductor chip, and
the first transistors and the second transistors are arranged in the common centroid layout.

What is claimed is:
1. A semiconductor device comprising:
a resistive subdivision circuit generating a first comparison voltage and a second comparison voltage different from the first comparison voltage based on subdividing an input voltage with different resistive subdivision ratios;
a first voltage detection circuit outputting a result of a comparison between a reference voltage and the first comparison voltage to an output node of the first voltage detection circuit;
a second voltage detection circuit outputting a result of a comparison between the reference voltage and the second comparison voltage to an output node of the second voltage detection circuit;
wherein the first voltage detection circuit includes:
a first transistor of a first conductive type coupled between the output node and a first power supply; and
a first transistor of a second conductive type having a gate supplied with the first comparison voltage, and coupled between the output node and a second power supply,
wherein the second voltage detection circuit includes:
a second transistor of the first conductive type coupled between the output node and the first power supply; and
a second transistor of the second conductive type having a gate supplied with the second comparison voltage, and coupled between the output node and the second power supply,
wherein a mirror current flows through each of the first and second transistors of the first conductivity type, the mirror current caused by a third transistor of the first conductivity type having a gate and a drain commonly coupled to a gate of the first transistor of the first conductivity type and a gate of the second transistor of the first conductivity type, and
wherein the third transistor is supplied with a bias current by a bias current generating circuit.

2. The semiconductor device according to claim 1, wherein the bias current generating circuit comprises:
a fourth transistor of the second conductive type coupled between the third transistor of the first conductivity type and the second power supply and driven by the reference voltage.

3. The semiconductor device according to claim 2,
wherein each of the first transistor of the first conductivity type, the second transistor of the first conductivity type, and the third transistor of the first conductivity type have the same transistor size, and
wherein each of the first transistor of the second conductivity type, the second transistor of the second conductivity type, and the fourth transistor have the same transistor size.

4. The semiconductor device according to claim 1,
wherein the resistive subdivision circuit further comprises:
a subdivided input voltage adjusting circuit to adjust a magnitude of the subdivided input voltage for driving at least one of the second transistors by selecting a plurality of input switches coupled to a plurality of resistive subdivision nodes of an input ladder resistor.

5. The semiconductor device according to claim 4, wherein the input switches couple each of the resistive subdivision nodes of the input ladder resistor to at least one drive node of the second transistors.

6. The semiconductor device according to claim 4, wherein the resistive subdivision circuit comprises:
a first input ladder resistor provided corresponding to one of the second transistors;
a second input ladder resistor provided corresponding to another one of the second transistors;
a first input switch unit to couple the input voltage selectively to one of the resistive subdivision nodes of the first input ladder resistor; and
a second input switch unit to couple the input voltage selectively to one of the resistive subdivision nodes of the second input ladder resistor.

7. The semiconductor device according to claim 2, further comprising:
a reference voltage generating circuit to generate the reference voltage for driving the fourth transistor,
wherein the reference voltage generating circuit comprises:

a reference ladder resistor;

a band gap reference circuit to generate a band gap voltage by adding a voltage with a positive temperature characteristic and a voltage with a negative temperature characteristic at a predetermined ratio and to apply the band gap voltage to the reference ladder resistor; and a reference voltage adjusting circuit to adjust a magnitude of the reference voltage, by selecting a plurality of reference switches coupled to a plurality of resistive subdivision nodes of the reference ladder resistor.

8. The semiconductor device according to claim 7, wherein the reference switches couple each of the plurality of resistive subdivision nodes of the reference ladder resistor to a drive node of the fourth transistor.

9. The semiconductor device according to claim 7, wherein a drive node of the fourth transistor is coupled immovably to one of the resistive subdivision nodes of the reference ladder resistor, and wherein the reference switches couple the band gap voltage selectively to one of the resistive subdivision nodes of the reference ladder resistor.

10. The semiconductor device according to claim 7, wherein the resistive subdivision circuit further comprises:

a subdivided input voltage adjusting circuit to adjust the magnitude of the subdivided input voltage for driving at least one of the second transistors, by selecting a plurality of input switches coupled to the resistive subdivision nodes of an input ladder resistor.

11. The semiconductor device according to claim 10, wherein the subdivided input voltage adjusting circuit selects the input switches based on trimming information determined in a manufacturing stage of the semiconductor device.

12. The semiconductor device according to claim 1, wherein the third transistor of the first conductivity type is arranged within a row of the first transistor of the first conductivity type and the second transistor of the first conductivity type arranged collaterally in a first area.

* * * * *